(12) United States Patent
Nanjo et al.

(10) Patent No.: US 8,035,130 B2
(45) Date of Patent: Oct. 11, 2011

(54) NITRIDE SEMICONDUCTOR HETEROJUNCTION FIELD EFFECT TRANSISTOR HAVING WIDE BAND GAP BARRIER LAYER THAT INCLUDES HIGH CONCENTRATION IMPURITY REGION

(75) Inventors: Takuma Nanjo, Tokyo (JP); Muneyoshi Suita, Tokyo (JP); Yuji Abe, Tokyo (JP); Toshiyuki Oishi, Tokyo (JP); Yasunori Tokuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 508 days.

(21) Appl. No.: 12/054,714

(22) Filed: Mar. 25, 2008

(65) Prior Publication Data

US 2008/0237639 A1 Oct. 2, 2008

(30) Foreign Application Priority Data

Mar. 26, 2007 (JP) ................. 2007-078306
Jul. 24, 2007 (JP) ................. 2007-191646
Feb. 1, 2008 (JP) ................. 2008-022555

(51) Int. Cl.
*H01L 29/778* (2006.01)
(52) U.S. Cl. ............... 257/194; 257/615; 257/E29.252
(58) Field of Classification Search ............ 257/E49.002
See application file for complete search history.

(56) References Cited

U.S. PATENT DOCUMENTS

| 2007/0045670 A1 | 3/2007 | Kuraguchi |
| 2007/0158683 A1* | 7/2007 | Sheppard et al. ............ 257/183 |
| 2010/0244041 A1 | 9/2010 | Oishi et al. |

FOREIGN PATENT DOCUMENTS

| JP | 2001-326232 | 11/2001 |
| JP | 2003-243423 | 8/2003 |
| JP | 2004-228481 | 8/2004 |
| JP | 2006-134935 | 5/2006 |
| JP | 2006-222160 | 8/2006 |
| JP | 2007-67240 | 3/2007 |

OTHER PUBLICATIONS

Takuma Nanjo, et al.,"Remarkable Breakdown Voltage Enhancement in AlGaN Channel HEMTs", IEDM 2007, Tech. Digest, 4 pages.

Yasuhiro Okamoto et al., "L-Band High Output AlGaN/GaN Heterojunction FET on SiC Substrate", Technical Report of IEICE, The Institute of Electronicl, Information and Communication Engineers, 2002, ED2002-94, 5 pages.

* cited by examiner

*Primary Examiner* — Stephen W Smoot
(74) *Attorney, Agent, or Firm* — Oblon, Spivak, McClelland, Maier & Neustadt, L.L.P.

(57) ABSTRACT

The objective of the present invention is to provide a semiconductor device of a hetero-junction field effect transistor that is capable of obtaining a high output and a high breakdown voltage and a manufacturing method of the same. The present invention is a semiconductor device of a hetero-junction field effect transistor provided with an $Al_xGa_{1-x}N$ channel layer with a composition ratio of Al being x ($0<x<1$) formed on a substrate, an $Al_yGa_{1-y}N$ barrier layer with a composition of Al being y ($0<y\leq1$) formed on the channel layer, and source/drain electrodes and a gate electrode formed on the barrier layer, wherein the composition ratio y is larger than the composition ratio x.

9 Claims, 20 Drawing Sheets

F I G . 1
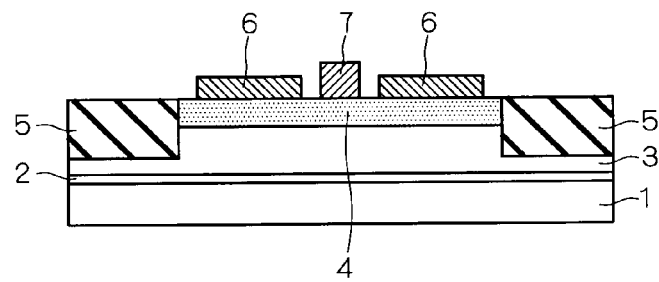
F I G . 2
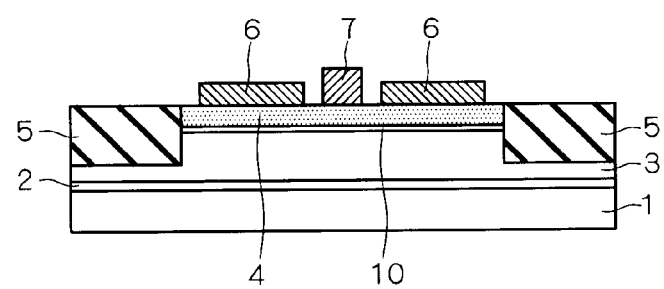
F I G . 3
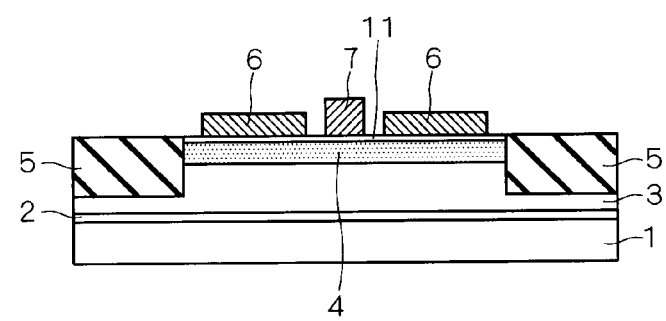
F I G . 4
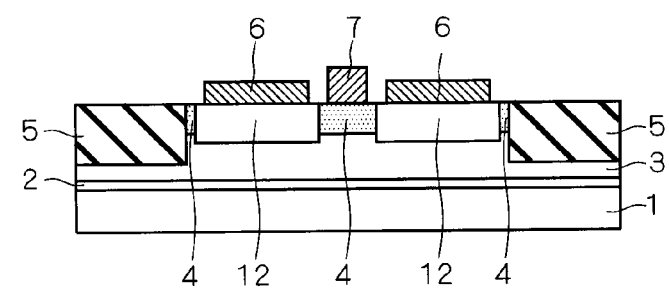

F I G . 1 1
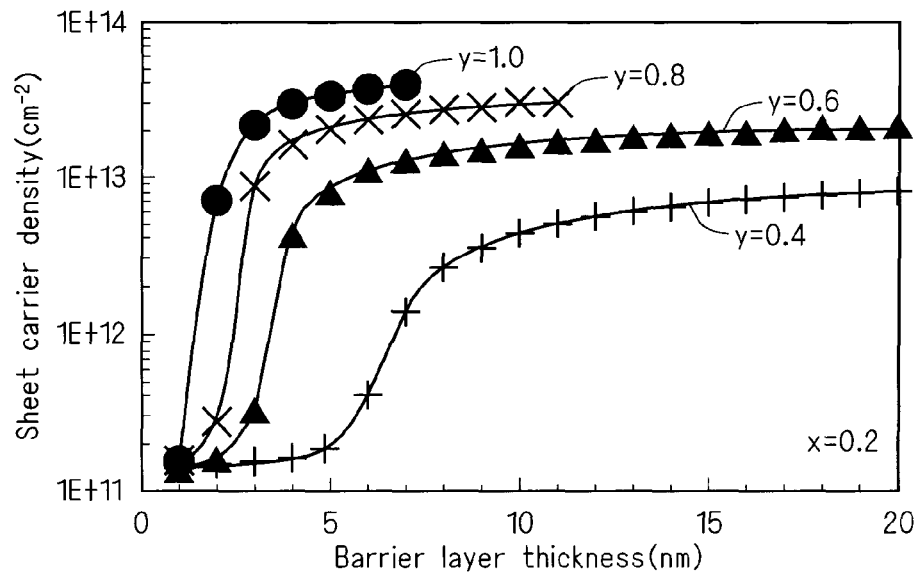
F I G . 1 2
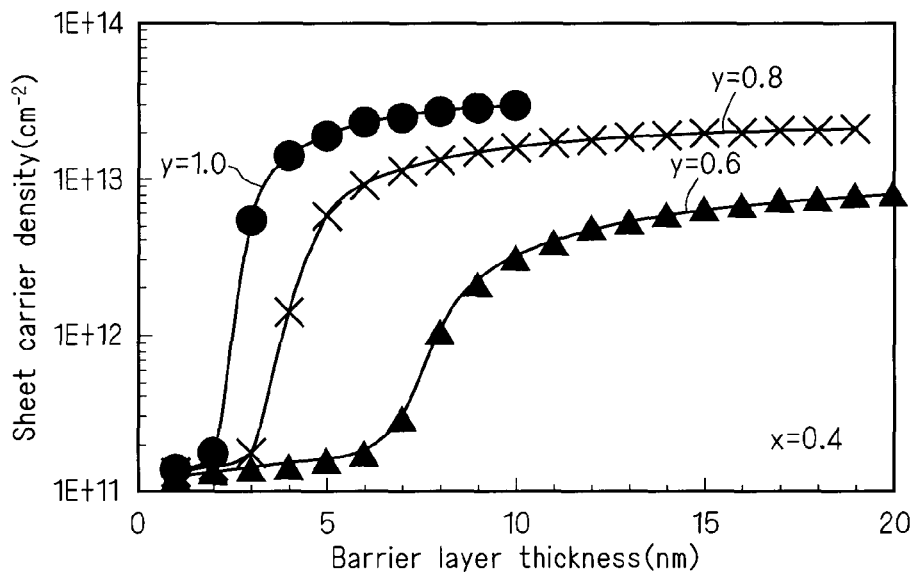

F I G . 1 5
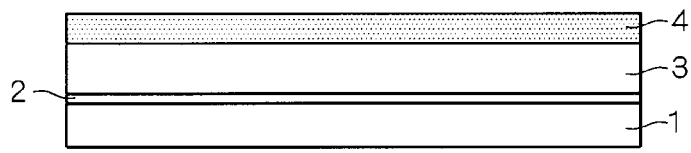
F I G . 1 6
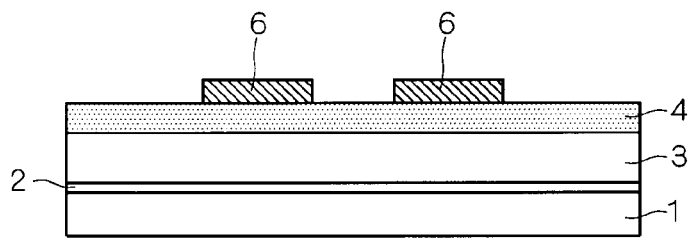
F I G . 1 7
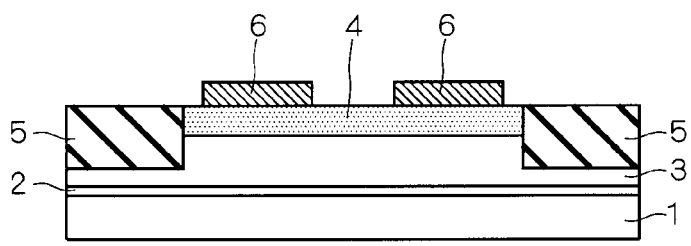
F I G . 1 8
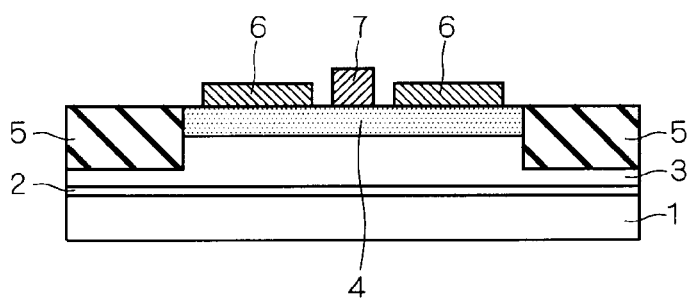

F I G . 2 9
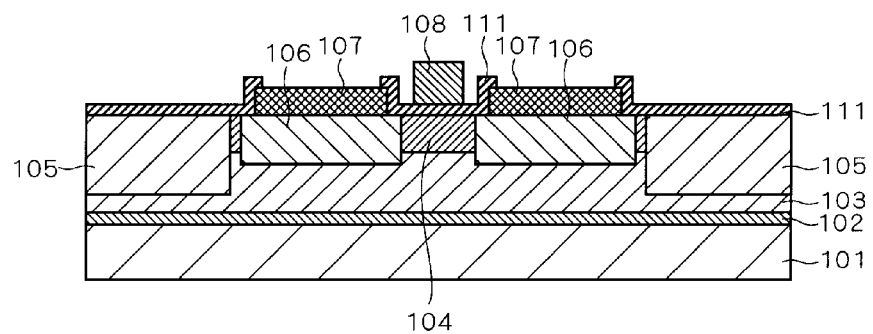
F I G . 3 0
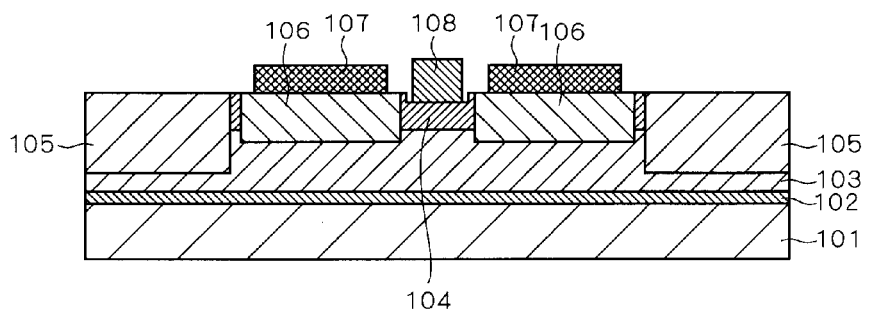

F I G . 3 7
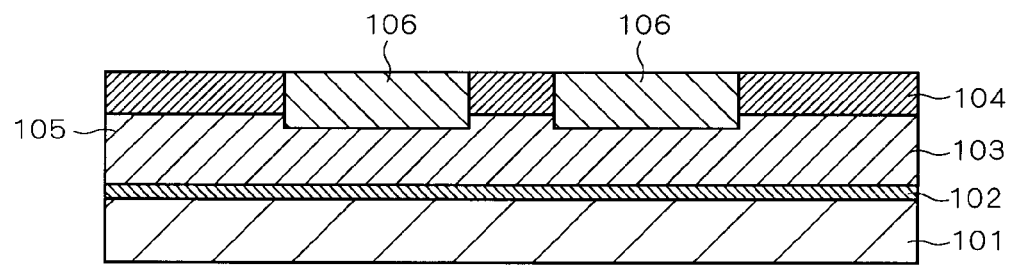
F I G . 3 8
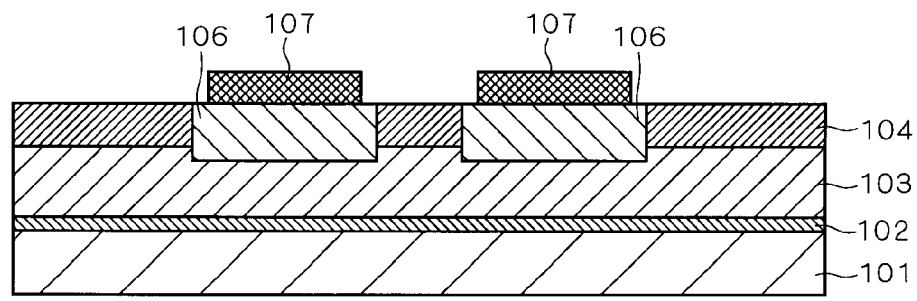

NITRIDE SEMICONDUCTOR HETEROJUNCTION FIELD EFFECT TRANSISTOR HAVING WIDE BAND GAP BARRIER LAYER THAT INCLUDES HIGH CONCENTRATION IMPURITY REGION

BACKGROUND OF THE INVENTION

1. Field of the Invention

The present invention is an invention relating to a semiconductor device and a manufacturing method of the same, and especially relating to a semiconductor device of a hetero-junction field effect transistor and a manufacturing method of the same.

2. Description of the Background Art

A GaN layer is used as a channel layer in a conventional hetero-junction field effect transistor of a semiconductor device containing nitride. A specific configuration is disclosed in Yasuhiro Okamoto and 5 others, "L-Band High Output AlGaN/GaN Hetero-junction FET on SiC Substrate", Technical Report of IEICE, The Institute of Electronics, Information and Communication Engineers, 2002, ED2002-94, pp. 85-88. An L-band high output AlGaN/GaN hetero-junction FET on a SiC substrate is disclosed in Yasuhiro Okamoto and 5 others, "L-Band High Output AlGaN/GaN Hetero-junction FET on SiC Substrate", Technical Report of IEICE, The Institute of Electronics, Information and Communication Engineers, 2002, ED2002-94, pp. 85-88., and it is a hetero-junction field effect transistor consisting of a nitride semiconductor using a GaN layer as a channel layer.

Further, in a conventional hetero-junction field effect transistor consisting of a nitride semiconductor, a source/drain electrode is formed with a deposited film in which a metal layer consisting of a plurality of Ti/Al etc. is alloyed, and a region doped with n-type impurities at a higher concentration than that of a lower part of the gate electrode by using a Si ion implantation method, etc. is provided. For example, the hetero-junction field effect transistor consisting of a nitride semiconductor described in Japanese Patent Application Laid-Open No. 2006-134935.

SUMMARY OF THE INVENTION

However, a desired output cannot be obtained in the conventional hetero-junction field effect transistor consisting of a nitride semiconductor, and it is necessary to make it have a higher output. Further, making a device have a high breakdown voltage has been one of the effective means in order to make the hetero-junction field effect transistor have a high output.

Further, it is effective to make a field effect transistor have a high breakdown voltage in order to make the hetero-junction field effect transistor consisting of a nitride semiconductor have a high output. It becomes effective for obtaining a high breakdown voltage to use a material having a higher electric breakdown field. However, because the higher the electric breakdown field the material has, the larger the band gap is, and on the contrary, a source/drain (ohmic) electrode having low resistance is difficult to form. Especially in the case of the hetero-junction field effect transistor, because it is necessary that the material used in the barrier layer has a larger band gap than that of the channel layer, when the material used in the channel layer has a large band gap, it becomes larger than the band gap of the material used in a barrier layer, and a source/drain (ohmic) electrode having low resistance is even more difficult to form.

The objective of the present invention is to provide a semiconductor device of a hetero-junction field effect transistor that is capable of obtaining a high output and a high breakdown voltage, and a manufacturing method of the same. Further, the objective of the present invention is to provide a hetero-junction field effect transistor consisting of a nitride semiconductor that is capable of realizing of a source/drain (ohmic) electrode with low resistance even when a nitride semiconductor having a large band gap is used.

One embodiment described in the present invention is a semiconductor device of a hetero-junction field effect transistor. Then, the semiconductor device according to the present invention includes an $Al_xGa_{1-x}N$ channel layer with a composition ratio of Al being x ($0<x<1$) formed on a substrate, an $Al_yGa_{1-y}N$ barrier layer with a composition of Al being y ($0<y\leq1$) formed on said channel layer, and source/drain electrodes and a gate electrode formed on said barrier layer, wherein said composition ratio y is larger than said composition ratio x.

Because the semiconductor device according to one embodiment of the present invention uses $Al_xGa_{1-x}N$ ($0<x<1$) with a larger electric breakdown field and a larger band gap than that of GaN in the channel layer, it becomes a semiconductor device of a hetero-junction field effect transistor that is capable of obtaining a high output and a high breakdown voltage.

One embodiment described in the present invention is a manufacturing method of a semiconductor device of a hetero-junction field effect transistor. Then, the manufacturing method of a semiconductor device according to the present invention includes a step of forming an $Al_xGa_{1-x}N$ channel layer with a composition ratio of Al being x ($0<x<1$) on a substrate, a step of forming an $Al_yGa_{1-y}N$ barrier layer with a composition of Al being y ($0<y\leq1$) on said channel layer wherein the composition ratio y is larger than the composition ratio x, and a step of forming source/drain electrodes and a gate electrode on said barrier layer.

Because the manufacturing method of a semiconductor device according to one embodiment of the present invention includes a step of forming an $Al_xGa_{1-x}N$ ($0<x<1$) channel layer with a larger electric breakdown field and a larger band gap than that of GaN, it can manufacture a semiconductor device of a hetero-junction field effect transistor that is capable of obtaining a high output and a high breakdown voltage.

One embodiment described in the present invention is a semiconductor device provided with a hetero-junction field effect transistor in which a channel layer comprising a first nitride semiconductor and a barrier layer comprising a second nitride semiconductor having a larger band gap than that of said first nitride semiconductor form a hetero-junction. Then, in the semiconductor device according to the present invention, the band gap of said first nitride semiconductor in said channel layer is 3.8 eV or more, and a high concentration n-type impurity region having an impurity concentration of $1\times10^{18}$ cm$^{-3}$ or more is formed immediately below source/drain electrodes of said hetero-junction field effect transistor.

The semiconductor device according to one embodiment of the present invention can reduce the ohmic contact resistance, and therefore it can realize a device having a large current and a high output.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional drawing of a hetero-junction field effect transistor according to Embodiment 1 of the present invention;

FIGS. 2 to 8 are cross-sectional drawings of the hetero-junction field effect transistor according to the modified example of Embodiment 1 of the present invention;

FIGS. 10 to 14 are drawings showing the relationship of sheet carrier density and a thickness of the barrier layer of the hetero-junction field effect transistor according to Embodiment 2 of the present invention;

FIGS. 15 to 18 are drawings to explain a manufacturing process of the hetero-junction field effect transistor according to Embodiment 3 of the present invention;

FIG. 29 is a vertical cross-sectional drawing showing a configuration of a hetero-junction field effect transistor consisting of a nitride semiconductor according to Modified Example 12 of Embodiment 4 of the present invention;

FIG. 30 is a vertical cross-sectional drawing showing a configuration of a hetero-junction field effect transistor consisting of a nitride semiconductor according to Modified Example 13 of Embodiment 4 of the present invention;

FIGS. 35 to 40 are vertical cross-sectional drawings showing one example of a manufacturing process of the hetero-junction field effect transistor consisting of a nitride semiconductor having a structure shown in FIG. 19;

DESCRIPTION OF THE PREFERRED EMBODIMENTS

Embodiment 1

Figure 5:
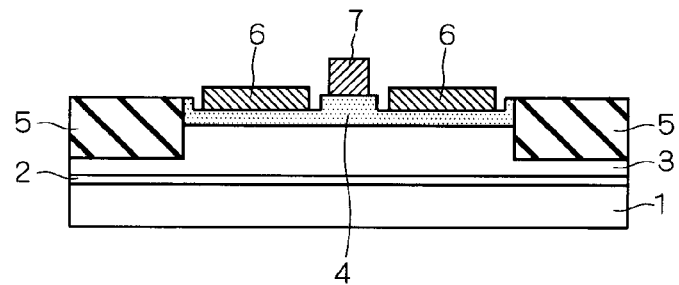

FIG. 1 is a cross-sectional drawing of the hetero-junction field effect transistor according to the embodiment of the present invention. In the hetero-junction field effect transistor shown in FIG. 1, a semi-insulated SiC substrate 1 is provided in the lowest layer, and a channel layer 3 of 1 μm thickness, consisting of $Al_{0.6}Ga_{0.4}N$, is provided on top of it via a buffer layer 2. Further, in the hetero-junction field effect transistor shown in FIG. 1, a barrier layer 4 of 10 nm thickness, consisting of AlN, forms a hetero-junction with the channel layer 3. Further, in the hetero-junction field effect transistor shown in FIG. 1, an element separation region 5 is provided in the regions on both sides in the drawing, and source/drain electrodes 6 consisting of Ti/Al and a gate electrode 7 consisting of Ni/Au are provided on the barrier layer 4.

The off breakdown voltage of the hetero-junction field effect transistor depends on the electric breakdown field of the channel layer 3. Therefore, in order to make the hetero-junction field effect transistor have high breakdown voltage, it is necessary to use a material with a large electric breakdown field in the channel layer 3. The off breakdown voltage of the hetero-junction field effect transistor will be explained in detail below.

It is assumed that after the channel layer 3 positioned immediately below the gate electrode 7 is firstly depleted, the depleted layer extends only in the lateral direction of the channel layer 3 (the drain electrode side), the voltage when the generated electric field reaches to the electric breakdown field of the material configuring the channel layer 3 can be calculated as the off breakdown voltage of the field effect transistor. Its calculating method is shown below. When the length of the depletion layer is made to be x, and the carrier concentration of the channel layer 3 is made to be Nd, an electric field E(x) and a voltage difference V(x) generated in the case that the length of the depletion layer is x can be obtained by solving Poisson's equation shown in the following Formula 1.

$$-\frac{\partial^2 V(x)}{\partial x^2} = \frac{\partial E(x)}{\partial x} = \frac{qN_d}{\varepsilon} \quad [\text{Formula 1}]$$

When the depletion layer is not stretched (x=0), both the electric field E(0) and the voltage difference V(0) are not generated, so E(0)=0 and V(0)=0, and by using this as a boundary condition, the electric field E(x) and voltage difference V(x) are obtained from Formulas 2 and 3 by solving Formula 1.

$$E(x) = \frac{qN_d}{\varepsilon} x \quad [\text{Formula 2}]$$

$$V(x) = -\frac{qN_d}{2\varepsilon} x^2 \quad [\text{Formula 3}]$$

Because the breakdown of the off state is generated when a generated electric field E(x) reaches an electric breakdown field (E a) of the material configuring the channel layer 3, a voltage (off breakdown voltage) $V_{BD}$ at that time is calculated from Formula 4.

$$V_{BD} = \frac{\varepsilon E_a^2}{2qN_d} \quad [\text{Formula 4}]$$

According to Formula 4, the off breakdown voltage is proportional to the square of the electric breakdown field of the material configuring the channel layer 3. The electric breakdown field of a semiconductor material depends on the band gap, and the larger the band gap, the higher the electric breakdown field is. Therefore, the electric breakdown field of AlN is higher than that of GaN, and the electric breakdown field of AlN is high as $1.2 \times 10^7$ (V/cm) compared with the electric breakdown field of GaN being $5.0 \times 10^6$ (V/cm).

The electric breakdown field of AlGaN is generally obtained by linearly interpolating the electric breakdown field of GaN and the electric breakdown field of AlN with the Al composition ratio. Therefore, the higher the Al composition ratio is, the higher the electric breakdown field of AlGaN is, and the off breakdown voltage of the hetero-junction field effect transistor in which AlGaN is used in the channel layer 3 becomes high. For example, when AlGaN having an Al composition ratio of 0.8 is used in the channel layer 3 shown in FIG. 1, the electric breakdown field becomes $9.2 \times 10^6$ (V/cm), and it becomes about two times compared with the electric breakdown field of GaN. Therefore, the off breakdown voltage of the hetero-junction field effect transistor is considered to become about four times compared with the case of using GaN in the channel layer 3.

Moreover, the hetero-junction field effect transistor according to the present invention is not limited to the hetero-junction field effect transistor shown in FIG. 1, and the same effect can be obtained even with the structure described below. First, Si, sapphire, GaN, AlN, etc. may be used as the substrate instead of the SiC substrate 1 shown in FIG. 1. Further, the channel layer 3 and the barrier layer 4 shown in FIG. 1 are not always limited to the Al composition ratio described above. When the Al composition ratio of AlGaN that configures the channel layer 3 is made to be x and the Al composition ratio of AlGaN that configures the barrier layer 4 is made to be y, the hetero-junction field effect transistor according to the present invention may have any composition ratio as long as it is configured so that a relationship of x<y is held. In this case, the composition ratio x is made to be 0<x<1, and the composition ratio y is made to be 0<y≦1.

Moreover, because the higher the Al composition ratio x of the channel layer 3 is, the higher the electric breakdown field becomes, and the off breakdown voltage improves accordingly with it as described above, the Al composition ratio x of the channel layer 3 is preferably higher. Further, because the band gap of AlGaN that forms the barrier layer 4 also becomes high when the Al composition ratio y is higher, a leakage current from the gate electrode 7 to the drain electrode 6 can be suppressed. Moreover, the band gap becomes the highest in AlN having the largest Al composition ratio y. Therefore, the Al composition ratio y of the barrier layer 4 is preferably higher than the Al composition ratio x of the channel layer 3. These layers are not necessarily configured from one layer of the same composition, and may be configured with multi-layered films having different Al composition ratios. Further, n-type or p-type impurities may be contained in these layers.

Furthermore, the thickness of the barrier layer 4 shown in FIG. 1 is not necessarily made to be 10 nm as long as it is a thickness in which secondary electron gas is generated. Moreover, the thickness of the barrier layer 4 in order to generate the secondary electron gas is described in detail in Embodiment 2. Further, the thickness of the channel layer 3 shown in FIG. 1 is not necessarily made to be 1 μm, and it may be 0.005 μm to 4 μm.

Further, the source/drain electrode 6 shown in FIG. 1 is not necessarily formed with Ti/Al, and it may be formed with a metal such as Ti, Al, Ni, Ta, Au, Mo, and W or a multi-layer film constituted with these as long as the ohmic characteristics can be obtained.

Further, the gate electrode 7 shown in FIG. 1 is not necessarily formed with Ni/Au, and it may be formed with a metal such as Al, Pt, Au, Ni, and Pd, a silicide such as IrSi, PtSi, and $NiSi_2$, or a nitride metal such as TiN and WN.

Next, the hetero-junction field effect transistor of FIG. 2 is shown as a modified example of the hetero-junction field effect transistor shown in FIG. 1. In the hetero-junction field effect transistor shown in FIG. 2, a spacer layer 10 consisting of GaN or AlN and having a film thickness of 0.1 nm to 5 nm is formed between the channel layer 3 and the barrier layer 4. Electron mobility of a hetero-interface can be improved and a large drain current can flow by inserting a binary semiconductor (the spacer layer 10) as shown in FIG. 2.

Next, the hetero-junction field effect transistor of FIG. 3 is shown as a modified example of the hetero-junction field effect transistor shown in FIG. 1. In the hetero-junction field effect transistor shown in FIG. 3, a cap layer 11 consisting of GaN and having a film thickness of 0.1 nm to 5 nm is formed on the barrier layer 4. The Schottky barrier of the gate electrode 7 becomes high, and the off breakdown voltage can be made high by providing the cap layer 11 as shown in FIG. 3.

Next, the hetero-junction field effect transistor of FIG. 4 is shown as a modified example of the hetero-junction field effect transistor shown in FIG. 1. In the hetero-junction field effect transistor shown in FIG. 4, a region 12 containing n-type impurities with Si etc. in high concentration is formed in the barrier layer 4 immediately below the source/drain electrodes 6 and in a part of the channel layer 3. Contact resistance can be made low by forming the region 12 as shown in FIG. 4.

Next, the hetero-junction field effect transistor of FIG. 5 is shown as a modified example of the hetero-junction field effect transistor shown in FIG. 1. The hetero-junction field effect transistor shown in FIG. 5 has a configuration of removing a part or all of the barrier layer 4 immediately below the source/drain electrodes 6. Furthermore, it may be a configuration of removing all of the barrier layer 4 immediately below the source/drain electrodes 6 and a part of the channel layer 3 in the present modified example. Moreover, it is a configuration of removing a part of the barrier layer 4 immediately below the source/drain electrodes 6 in the example shown in FIG. 5. Contact resistance can be made low by making the configuration as shown in FIG. 5.

Figure 6:
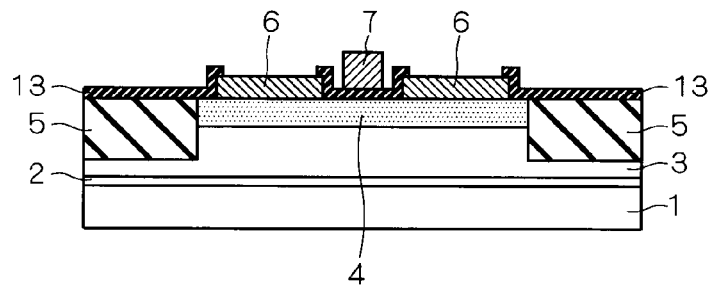

Next, the hetero-junction field effect transistor of FIG. 6 is shown as a modified example of the hetero-junction field effect transistor shown in FIG. 1. In the hetero-junction field effect transistor shown in FIG. 6, an insulating film layer 13 such as AlOx, SiNx, SiOx, HfOx, and TiOx is formed on the barrier layer 4 including immediately below the gate electrode 7. The insulating film layer 13 is formed on a part other than the barrier layer 4 in which the source/drain electrodes 6 are formed and on an element separation region 5 in the example shown in FIG. 6. The gate leakage current is decreased and the breakdown voltage between the gate and drain can be improved by providing the insulating film layer 13 as shown in FIG. 6.

Figure 7:
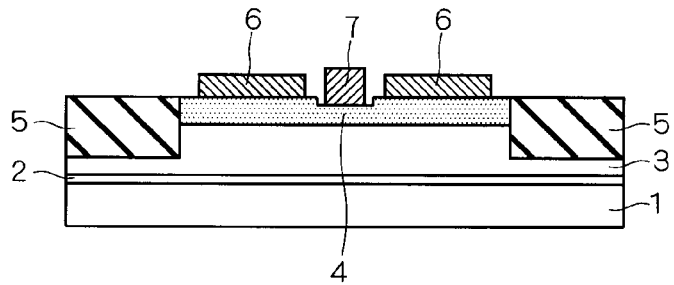

Next, the hetero-junction field effect transistor of FIG. 7 is shown as a modified example of the hetero-junction field effect transistor shown in FIG. 1. In the hetero-junction field effect transistor shown in FIG. 7, the gate electrode structure is not a planar structure, but adapts a recessed gate structure in which the gate electrode 7 is formed inside a region in which a part of the barrier layer 4 between the source/drain electrodes 6. Source resistance can be decreased compared to the case of the planar structure by making the gate electrode structure being the recessed gate structure as shown in FIG. 7.

Figure 8:
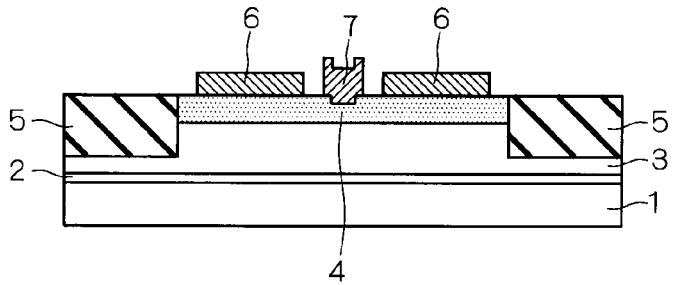

Next, the hetero-junction field effect transistor of FIG. 8 is shown as a modified example of the hetero-junction field effect transistor shown in FIG. 1. In the hetero-junction field effect transistor shown in FIG. 8, the gate electrode structure is not a planar structure, but adapts an embedded gate structure in which the gate electrode 7 is formed so as to cover a region in which a part of the barrier layer 4 between the source/drain electrodes 6. Source resistance can be decreased compared to the case of the planar structure by making the gate electrode structure being the embedded gate structure as shown in FIG. 8. Further, the electric field concentrated in the edge part of the drain electrode side of the gate electrode 7 can be relaxed during high voltage operation, and the breakdown voltage can be made high.

Moreover, the configurations of the above-described modified examples are not necessarily adapted individually, and the hetero-junction filed effect transistor may be configured by combining each of them.

Embodiment 2

Figure 9:
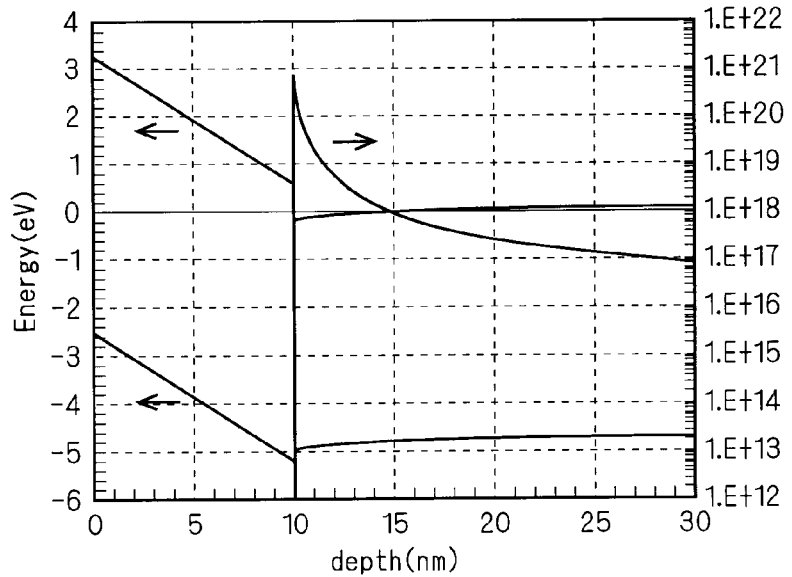
FIG. 9 is a drawing showing a calculation result of an energy band structure and a carrier concentration in a depth direction of a barrier layer and a channel layer of a hetero-junction field effect transistor according to Embodiment 2 of the present invention.

The calculation result of the energy band structure (energy (eV)) and the carrier concentration (cm$^{-3}$) in the depth direction of the barrier layer 4 and the channel layer 3 of the hetero-junction field effect transistor shown in FIG. 1 is shown in FIG. 9. The calculation result is obtained by solving Poisson's equation and Schrödinger's equation self-consistently. Moreover, values that are generally used are used as physical property values used in the above-described calculation.

In the graph shown in FIG. 9, the value in which the carrier concentration is integrated with the depth direction is made to be the sheet carrier density (Ns), and the sheet carrier density of the hetero-junction field effect transistor shown in FIG. 1 is obtained to be $1.6 \times 10^{13}$ (cm$^{-2}$).

Figure 10:
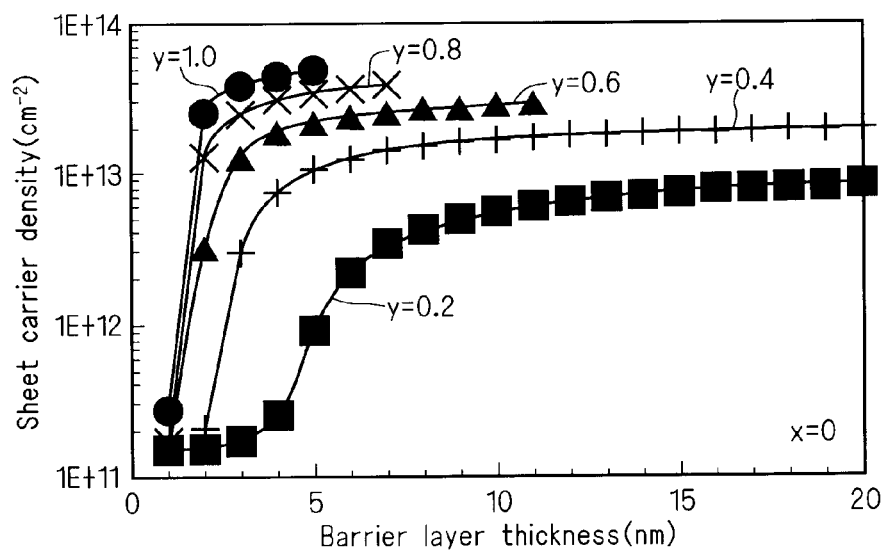
Figure 13:
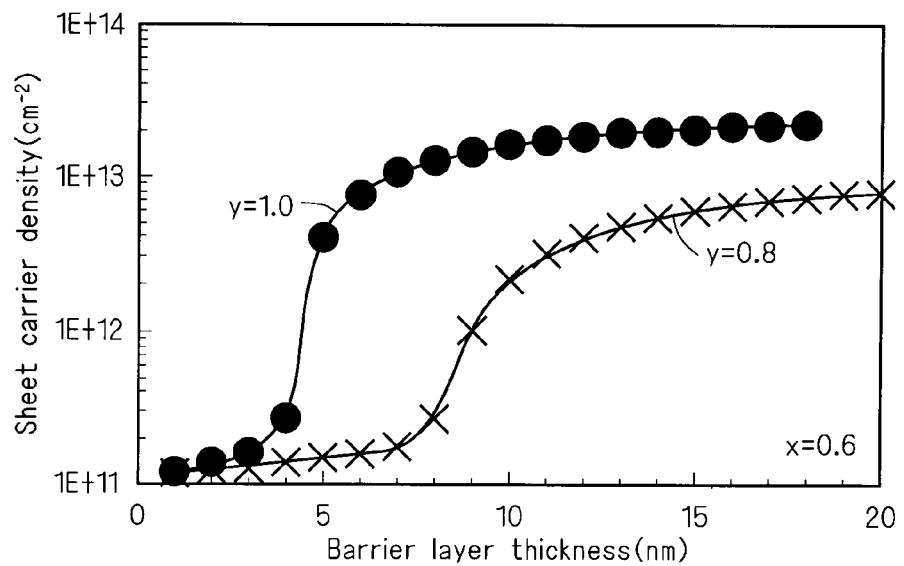
Figure 14:
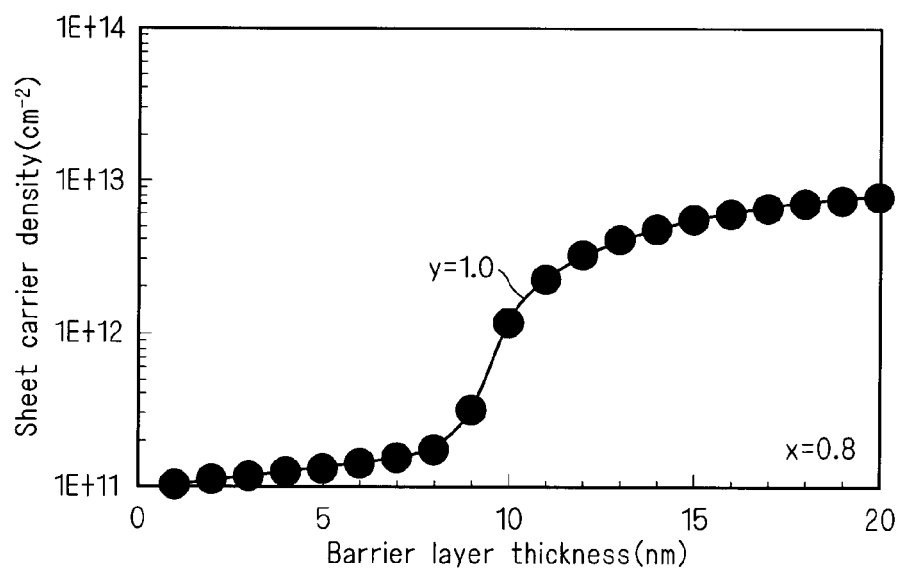

Similarly, the relationship of the sheet carrier density (cm$^{-2}$) and the thickness (t) (nm) of the barrier layer 4 in the case of combining the Al composition ratio x of the channel layer 3 and the Al composition ratio y of the barrier layer 4 is shown in FIGS. 10 to 14. FIG. 10 is a graph in which the Al composition ratio x of the channel layer 3 is fixed to 0, and the Al composition ratio y of the barrier layer 4 is varied from 0.2 to 1.0. FIG. 11 is a graph in which the Al composition ratio x of the channel layer 3 is fixed to 0.2, and the Al composition ratio y of the barrier layer 4 is varied from 0.4 to 1.0. FIG. 12 is a graph in which the Al composition ratio x of the channel layer 3 is fixed to 0.4, and the Al composition ratio y of the barrier layer 4 is varied from 0.6 to 1.0. FIG. 13 is a graph in which the Al composition ratio x of the channel layer 3 is fixed to 0.6, and the Al composition ratio y of the barrier layer 4 is varied from 0.8 to 1.0. FIG. 14 is a graph in which the Al composition ratio x of the channel layer 3 is made to be 0.8, and the Al composition ratio y of the barrier layer 4 is made to be 1.0.

It is found from FIGS. 10 to 14 that the sheet carrier density starts increasing rapidly when the barrier layer 4 becomes a certain thickness. The result of which thickness of the barrier layer 4 at which the sheet carrier density increases rapidly is shown in every combination of the Al composition ratio x and the Al combination ratio y in Table 1.

TABLE 1

| Thickness of Barrier Layer t (nm) | | Al Composition Ratio y of Barrier Layer | | | | | | | | | | |
|---|---|---|---|---|---|---|---|---|---|---|---|---|
| | | 0.05 | 0.1 | 0.15 | 0.2 | 0.25 | 0.3 | 0.35 | 0.4 | 0.45 | 0.5 | 0.55 |
| Al Composition Ratio x of Channel | 0 | 11 | 6 | 4.5 | 3 | 2.5 | 2 | 1.5 | 1 | 1 | 1 | 1 |
| | 0.05 | | 13 | 7 | 5.5 | 5.25 | 3 | 2.25 | 1.5 | 1.5 | 1.5 | 1.25 |
| | 0.1 | | | 15 | 8 | 8 | 4 | 3 | 2 | 2 | 2 | 1.5 |
| | 0.15 | | | | 16 | 8 | 6.5 | 5 | 3.5 | 3 | 2.5 | 2 |

TABLE 1-continued

| Layer | 0.2 | | | 18 | 9 | 7 | 5 | 4 | 3 | 2.5 |
|---|---|---|---|---|---|---|---|---|---|---|
| | 0.25 | | | | 19 | 10 | 8 | 6 | 4 | 3.25 |
| | 0.3 | | | | | 21 | 11 | 8 | 5 | 4 |
| | 0.35 | | | | | | 22 | 11 | 8.5 | 6.5 |
| | 0.4 | | | | | | | 24 | 12 | 9 |
| | 0.45 | | | | | | | | 25 | 12 |
| | 0.5 | | | | | | | | | 26 |
| | 0.55 | | | | | | | | | |
| | 0.6 | | | | | | | | | |
| | 0.65 | | | | | | | | | |
| | 0.7 | | | | | | | | | |
| | 0.75 | | | | | | | | | |
| | 0.8 | | | | | | | | | |
| | 0.85 | | | | | | | | | |
| | 0.9 | | | | | | | | | |
| | 0.95 | | | | | | | | | |

| | Thickness of Barrier Layer t (nm) | Al Composition Ratio y of Barrier Layer | | | | | | | | |
|---|---|---|---|---|---|---|---|---|---|---|
| | | 0.6 | 0.65 | 0.7 | 0.75 | 0.8 | 0.85 | 0.9 | 0.95 | 1 |
| Al Composition Ratio x of Channel Layer | 0 | 1 | 1 | 1 | 1 | 1 | 1 | 1 | 1 | 1 |
| | 0.05 | 1 | 1 | 1 | 1 | 1 | 1 | 1 | 1 | 1 |
| | 0.1 | 1 | 1 | 1 | 1 | 1 | 1 | 1 | 1 | 1 |
| | 0.15 | 1.5 | 1.5 | 1.5 | 1.25 | 1 | 1 | 1 | 1 | 1 |
| | 0.2 | 2 | 2 | 2 | 1.5 | 1 | 1 | 1 | 1 | 1 |
| | 0.25 | 2.5 | 2.25 | 2 | 1.75 | 1.5 | 1.25 | 1 | 1 | 1 |
| | 0.3 | 3 | 2.5 | 2 | 2 | 2 | 1.5 | 1 | 1 | 1 |
| | 0.35 | 4.5 | 3.75 | 3 | 2.75 | 2.5 | 2 | 1.5 | 1.5 | 1.5 |
| | 0.4 | 6 | 5 | 4 | 3.5 | 3 | 2.5 | 2 | 2 | 2 |
| | 0.45 | 9.5 | 7.25 | 5 | 4.25 | 3.5 | 3 | 2.5 | 2.25 | 2 |
| | 0.5 | 13 | 9.5 | 6 | 5 | 4 | 3.5 | 3 | 2.5 | 2 |
| | 0.55 | 27 | 13 | 10 | 7.75 | 5.5 | 4.5 | 3.5 | 3 | 2.5 |
| | 0.6 | | 28 | 14 | 10.5 | 7 | 5.5 | 4 | 3.5 | 3 |
| | 0.65 | | | 29 | 14 | 11 | 8.25 | 5.5 | 4.75 | 4 |
| | 0.7 | | | | 30 | 15 | 11 | 7 | 6 | 5 |
| | 0.75 | | | | | 31 | 15 | 11.5 | 9 | 6.5 |
| | 0.8 | | | | | | 32 | 16 | 12 | 8 |
| | 0.85 | | | | | | | 33 | 16 | 12.5 |
| | 0.9 | | | | | | | | 34 | 17 |
| | 0.95 | | | | | | | | | 35 |

In Table 1, for example, it is found that it is good if the thickness of the barrier layer 4 is made to be 5 nm or more in the case that the Al composition ratio x of the channel layer 3 is made to be 0.2 and the Al composition ratio y of the barrier layer 4 is made to be 0.4. By making the thickness of the barrier layer 4 to the value or more (5 nm in the above-described example) shown in Table 1, a sufficiently high sheet carrier density can be obtained, and a sufficiently high drain current can be obtained during producing the field effect transistor.

Moreover, the thickness of the barrier layer 4 is determined from the value based on Table 1 in the present embodiment. However, a portion where the Al composition ratios x and y are not shown in Table 1 are obtained by dividing internally the value adjacent to the portion. That is, in the case that the Al composition ratio x is between x1 and x2 and the Al composition ratio y is between y1 and y2, first, t(x1, y1) and t(x1, y2) are divided internally, and t(x2, y1) and t(x2, y2) are divided internally. Then, the barrier layer 4 is formed having the thickness of the value t(x, y) or more obtained by further dividing internally t(x1, y) and t(x2, y) obtained by dividing internally as described above.

Explaining more specifically, the thickness t (nm) of the barrier layer is made to be thicker than the t(x, y) value in Table 1 in the case that the Al composition ratio is x and the Al composition ratio is y. For example, it is found from Table 1 that it is good if the thickness t of the barrier layer is made to be 8 nm or more in the case that the Al composition ratio x is 0.1 and the Al composition ratio y is 0.2.

Further, in the case that the Al composition ratio x and the Al composition ratio y are not described in Table 1 and have the relationship of $x+0.05 \leq y < x+0.1$, a maximum value described in Table 1 in the range that is 0.05 step smaller than the Al composition ratio x is made to be x1, a value in which 0.05 is added to x1 is made to be x2, a maximum value described in Table 1 in the range that is 0.05 step smaller than the Al composition ratio y is made to be y1, and a value in which 0.05 is added to y1 is made to be y2. Then, a value of $[y2 \times t(x1, y1) - y1 \times t(x1, y2) + \{t(x1, y2) - t(x1, y1)\} \times y]/0.05 = t(x1, y)$ is obtained from t(x1, y1) and t(x1, y2) in Table 1. Furthermore, a value of $[x2 \times t(x1, y) - x1 \times t(x2, y2) + \{t(x2, y2) - t(x1, y)\} \times x]/0.05 = t(x, y)$ is obtained from the value of t(x2, y2) in Table 1 and the above-described t(x1, y), and the thickness t (nm) of the barrier layer is made to be the value of t(x, y) or more.

For example, the above-described relationship is satisfied in the case that the Al composition ratio x is 0.13 and the Al composition ratio y is 0.19. Therefore, a maximum value described in Table 1 in the range that is 0.05 step (0.13 to 0.08) smaller than the Al composition ratio x of 0.13 becomes 0.1, and the value is made to be x1. Then, 0.15 where 0.05 is added to 0.1 that is x1 becomes x2. Similarly, a maximum value described in Table 1 in the range that is 0.05 step (0.19 to 0.14) smaller than the Al composition ratio y of 0.19 becomes 0.15, and the value is made to be y1. Then, 0.2 where 0.05 is added to 0.15 that is y1 becomes y2.

Then, t(x1, y) is obtained as $t(0.1, 0.19) = [0.2 \times t(0.1, 0.15) - 0.15 \times t(0.1, 0.2) + \{t(0.1, 0.2) - t(0.1, 0.15)\} \times 0.19]/0.05 = [0.2 \times$ 15−0.15×8+{8−15}×0.19]/0.05=9.4. Furthermore, t(x, y) is obtained as t(0.13, 0.19)=[0.15×t(0.1, 0.19)−0.1×t(0.15, 0.2)+{t(0.15, 0.2)−t(0.1, 0.19)}×0.13]/0.05=[0.15×9.4−0.1× 16+{16−9.4}×0.13]/0.05=13.36. As the result, the thickness t (nm) of the barrier layer is made to be the t(0.13, 0.19)=13.36 nm or more.

Further, in the case that the Al composition ratio x and the Al composition ratio y are not described in Table 1 and have a relationship of y≧x+0.1, a maximum value described in Table 1 in the range that is 0.05 step smaller than the Al composition ratio x is made to be x1, a value in which 0.05 is added to x1 is made to be x2, a maximum value described in Table 1 in the range that is 0.05 step smaller from the Al composition ratio y is made to be y1, and a value in which 0.05 is added to y1 is made to be y2. Then, a value of [x2×t(x1, y1)−x1×t(x2, y1)+{t(x2, y1)−t(x1, y1)}×x]/0.05=t(x, y1) is obtained from t(x1, y1) and t(x2, y1) in Table 1. A value of [x2×t(x1, y2)−x1×t(x2, y2)+{t(x2, y2)−t(x1, y2)}×x]/0.05=t (x, y2) is obtained from t(x1, y2) and t(x2, y2) in Table 1. Furthermore, a value of [y2×t(x, y1)−y1×t(x, y2)+{t(x, y2)−t(x, y1)}×y]/0.05=t(x, y) is obtained from the value of t(x, y1) and the thickness t(x, y2), and the thickness t (nm) of the barrier layer is made to be the value of t(x, y) or more.

For example, the above-described relationship is satisfied in the case that the Al composition ratio x is 0.22 and the Al composition ratio y is 0.42. Therefore, a maximum value described in Table 1 in the range that is 0.05 step (0.22 to 0.17) smaller than the Al composition ratio x of 0.22 becomes 0.2, and the value is made to be x1. Then, 0.25 where 0.05 is added to 0.2 that is x1 becomes x2. Similarly, a maximum value described in Table 1 in the range that is 0.05 step (0.42 to 0.37) smaller than the Al composition ratio y of 0.42 becomes 0.4, and the value is made to be y1. Then, 0.45 where 0.05 is added to 0.4 that is y1 becomes y2.

Then, t(x, y1) is obtained as t(0.22, 0.4)=[0.25×t(0.2, 0.4)−0.2×t(0.25, 0.4)+{t(0.25, 0.4)−t(0.2, 0.4)}×0.22]/0.05= [0.25×5−0.2×8+{8−5}×0.22]/0.05=6.2. t(x, y2) is obtained as t(0.22, 0.45)=0.25×t(0.2, 0.45)−0.2×t(0.25, 0.45)+{t(0.25, 0.45)−t(0.2, 0.45)}×0.22]/0.05=0.25×4−0.2×6+{6−4}× 0.22]/0.05=4.8.

Furthermore, t(x, y) is obtained as t(0.22, 0.42)=[0.45×t (0.22, 0.4)−0.4×t(0.22, 0.45)+{t(0.22, 0.45)−t(0.22, 0.4)}× 0.42]/0.05=[0.45×6.2−0.4×4.8+{4.8−6.2}×0.42]/0.05=5.64. As the result, the thickness t (nm) of the barrier layer is made to be the t(0.22, 0.42)=5.64 nm or more.

Moreover, a way of obtaining the portion that is not described in Table 1 is not limited to the above-described way, and it may be a mode of obtaining a function that can apply to the part and supplementing the value of the thickness t of the barrier layer by using the function.

Embodiment 3

A manufacturing process of the hetero-junction field effect transistor shown in FIG. 1 is shown in FIGS. 15 to 18. Moreover, the same reference numbers are appended to the constituting elements in FIGS. 15 to 18 that are the same constituting elements shown in FIG. 1, and detailed explanation is omitted. First, with respect to FIG. 15, the buffer layer 2, the channel layer 3 consisting of $Al_{0.6}Ga_{0.4}N$, and the barrier layer 4 consisting of AlN are epitaxial grown in order by applying an epitaxial growth method such as a MOCVD (Metal Organic Chemical Vapor Deposition) method and a MBE (Molecular Beam Epitaxy) method on the SiC substrate 1.

Next, with respect to FIG. 16, a metal layer such as Ti, Al, Ni, Ta, Au, Mo, and W is deposited by using a vapor deposition method or a sputter method, and the source/drain electrodes 6 are formed with a lift-off method, etc.

Next, with respect to FIG. 17, the element separation region 5 is formed in the channel layer 3 and the barrier layer 4 that are outside of the region where the hetero-junction field effect transistor is produced, by using an ion implantation method, an etching method, etc. The element separation region shown in FIG. 17 is formed by using an ion implantation method.

Next, with respect to FIG. 18, a layer consisting of a metal such as Al, Pt, Au, Ni, and Pd, a silicide such as IrSi, PtSi, and $NiSi_2$, or a nitride metal such as TiN and WN is deposited by using a vapor deposition method or a sputter method, and the gate electrode 7 is formed with a lift-off method, etc.

The hetero-junction field effect transistor shown in FIG. 1 can be produced by performing the manufacturing process shown above. Moreover, only a necessary and minimum process for operating as a transistor is described in the above-described manufacturing process. However, it is finally completed as a device after going through a process of forming a protective film, wirings, a via-hole, etc.

Moreover, a typical condition is described above. However, a hetero-junction field effect transistor can be produced under the condition shown below in which the effects of the present invention can be obtained.

First, desired Al composition ratios of the channel layer 3 and the barrier layer 4 can be obtained by adjusting flow rate, pressure, and temperature of trimethyl ammonium, trimethyl gallium, ammonia, etc. that become the raw material gas of AlGaN during the epitaxial growth of the channel layer 3 and the barrier layer 4 shown in FIG. 15. Herewith, a hetero-junction field effect transistor that satisfies the condition of the Al composition ratio shown in Embodiment 1 can be produced.

Further, the channel layer 3 shown in FIG. 15 is epitaxial grown, and then a thin layer (the spacer layer 10) of 0.1 to 5 nm thickness, consisting of GaN or AlN, is epitaxial grown, and the barrier layer 4 may be epitaxial grown on the spacer layer 10. Herewith, the hetero-junction field effect transistor shown in FIG. 2 explained in Embodiment 1 can be produced, and a hetero-junction field effect transistor can be obtained that can improve the electron mobility and can flow a large drain current.

Further, the barrier layer 4 shown in FIG. 15 is epitaxial grown, and then a thin layer (the cap layer 11) of 0.1 to 5 nm thickness, consisting of GaN, may be epitaxial grown. Herewith, the hetero-junction field effect transistor shown in FIG. 3 explained in Embodiment 1 can be produced, and the off breakdown voltage can be made high.

Further, the formation of the source/drain electrodes 6 shown in FIG. 16, the formation of the element separation region 5 shown in FIG. 17, and the formation of the gate electrode 7 shown in FIG. 18 are not necessarily performed in the above-described order, and the order of the steps may be exchanged. For example, the manufacturing process of forming the element separation region 5 may be performed before forming the source/drain electrodes 6.

Further, in the formation of the source/drain electrodes 6 shown in FIG. 16, a region 12 doped with ions that is a semiconductor such as Si and that becomes n-type at high concentration by using an ion implantation method, etc. is formed, and the source/drain electrodes 6 may be formed on the region 12. Herewith, the hetero-junction field effect transistor shown in FIG. 4 explained in Embodiment 1 can be produced, and the contact resistance can be reduced.

Further, in the formation of the source/drain electrodes 6 shown in FIG. 16, a part or all of the barrier layer 4 immediately below the source/drain electrodes 6 is removed by using a dry etching method that uses $Cl_2$ etc. for example, and then the source/drain electrodes 6 may be formed. Moreover, in addition to the above-described examples, all of the barrier layer 4 immediately below the source/drain electrodes 6 is removed, a part of the channel layer 3 is removed, and then, the source/drain electrodes 6 may be formed. Herewith, the hetero-junction field effect transistor shown in FIG. 5 explained in Embodiment 1 can be produced, and the contact resistance can be reduced.

Further, in the formation of the gate electrode 7 shown in FIG. 17, an insulation film 13 such as AlOx, SiNx, SiOx, HfOx, and TiOx is deposited on the barrier layer 4 by using a vapor deposition method, a plasma CVD method, etc., and the gate electrode 7 may be formed on the insulation film 13. Herewith, the hetero-junction field effect transistor shown in FIG. 6 explained in Embodiment 1 can be produced, the gate leakage current can be reduced, and the breakdown voltage between the gate and the source can be improved. Moreover, it is necessary to form wirings on the corresponding part by removing a part of the source/drain electrodes 6 covered with the insulation film 13 by wet-etching with fluoric acid, etc. in order to finally use it as a device.

Further, in the formation of the gate electrode 7 shown in FIG. 17, a part of the barrier layer 4 between the source/drain electrodes 6 is removed by using a dry-etching method with $Cl_2$, etc., a recess is formed in advance, and then the gate electrode 7 may be formed. Herewith, the hetero-junction field effect transistor shown in FIGS. 7 and 8 explained in Embodiment 1 can be produced, and the source resistance can be reduced in comparison with the case of the planar structure.

Embodiment 4

Figure 19:
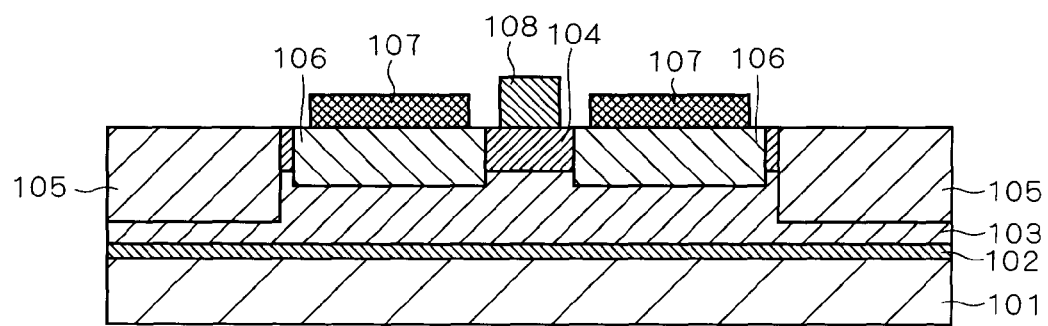
FIG. 19 is a vertical cross-sectional drawing showing a configuration of a hetero-junction field effect transistor consisting of a nitride semiconductor according to Embodiment 4 of the present invention.

FIG. 19 is a vertical cross-sectional drawing showing one example of a structure of the hetero-junction field effect transistor consisting of a nitride semiconductor according to the present embodiment.

With respect to FIG. 19, the lowest layer is the semi-insulating SiC substrate 101, and a channel layer 103 consisting of $Al_xGa_{1-x}N$ ($0.16 \leq x \leq 1$) (corresponding to a first nitride semiconductor) is formed on the top surface of the semi-insulating SiC substrate 101 via a buffer layer 102. Furthermore, a barrier layer 104 consisting of $Al_yGa_{1-y}N$ ($0.39 \leq y \leq 1$, $x<y$) (corresponding to a second nitride semiconductor) that forms a hetero-junction with the channel layer 103 is formed on the top surface of the channel layer 103. A region 105 is the element separation region. Further, a region 106 piercing the barrier layer 104 and in which its bottom surface is in the channel layer 103 is a high concentration n-type impurity region with an impurity concentration of $1 \times 10^{18}$ cm$^{-3}$ or more. Further, the source/drain electrodes 107 formed on the upper surface of each high concentration n-type impurity region 106 consists of Ti/Al for example. Further, a gate electrode 108 formed on the upper surface of the region of the barrier layer 104 sandwiched with each high concentration n-type impurity region 106 consists of Ni/Au for example.

Figure 32:
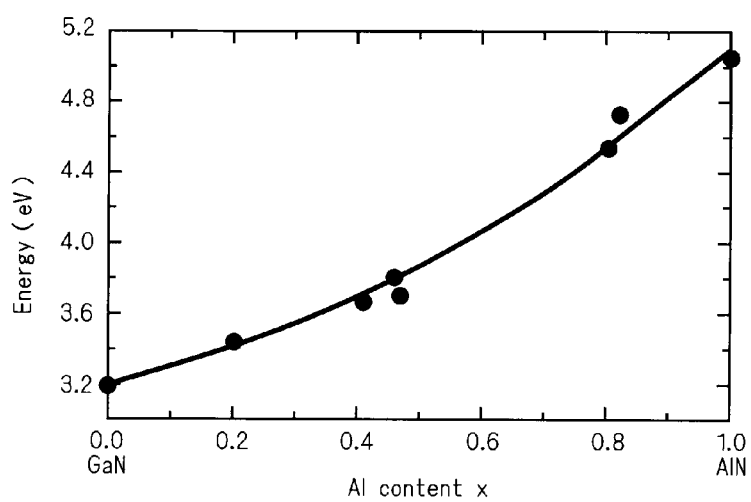
FIG. 32 is a drawing showing an Al composition dependency of $Al_bGa_{1-b}N$.

Here, as shown in FIG. 32 of (http://www.opt.ees.saitama-u.ac.jp/~zyoho/suzuki/ene.html), it is understood that the band gap energy of $Al_bGa_{1-b}N$ increases as Al composition b becomes larger.

Figure 20:
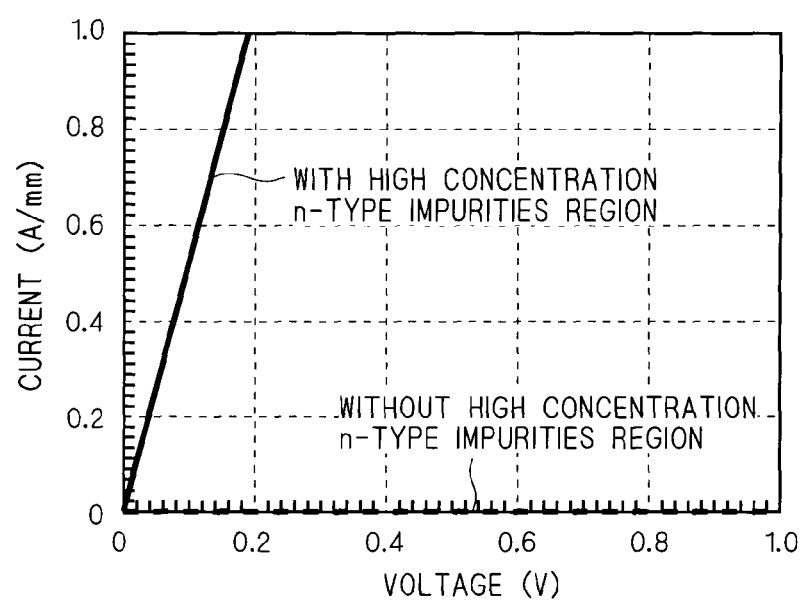
FIG. 20 is a drawing showing a voltage dependency of current flowing between source/drain electrodes in the case that a high concentration n-type impurities region is formed and the case that it is not formed.
Figure 21:
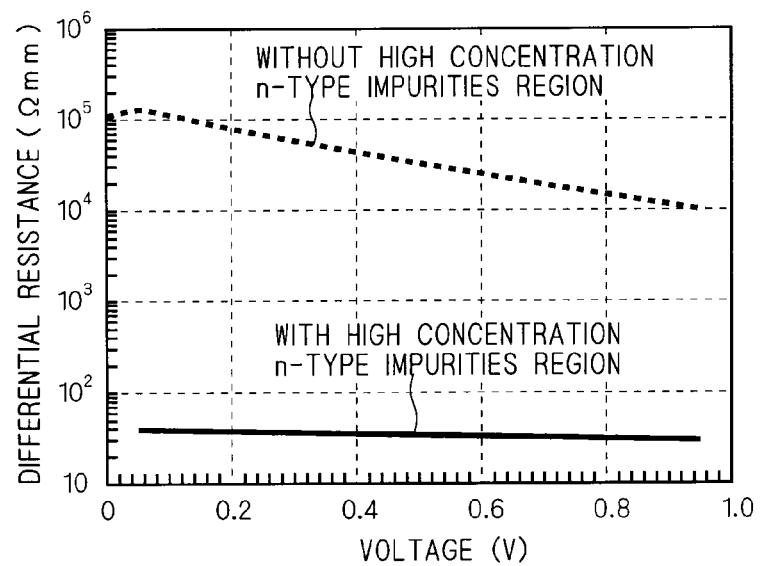
FIG. 21 is a drawing showing a voltage dependency of differential resistance in the case that a high concentration n-type impurities region is formed and the case that it is not formed.

FIG. 20 is a drawing showing the voltage dependency of current flowing between source/drain electrodes 107 in the case that the high concentration n-type impurities region 106 is formed and the case that it is not formed in a hetero-epitaxial substrate consisting of a nitride semiconductor having the same structure with that in FIG. 19. Further, FIG. 21 is a drawing showing the voltage dependency of resistance obtained by differentiating the voltage of FIG. 20 by the current. Moreover, the values in the graphs of FIGS. 20 and 21 are in the case that the Al composition x of the channel layer 103 is 0.2 and the Al composition of the barrier layer 104 is 0.4. In the case that the high concentration n-type impurities region 106 is not formed, the resistance is very high, and it is difficult to obtain large output even when it is operated as a transistor. Contrary to that, in the case that the high concentration n-type impurities region 106 is formed, a large drain current can be obtained, and a large output can be obtained when it is operated as a transistor because the resistance is largely reduced.

Figure 41:
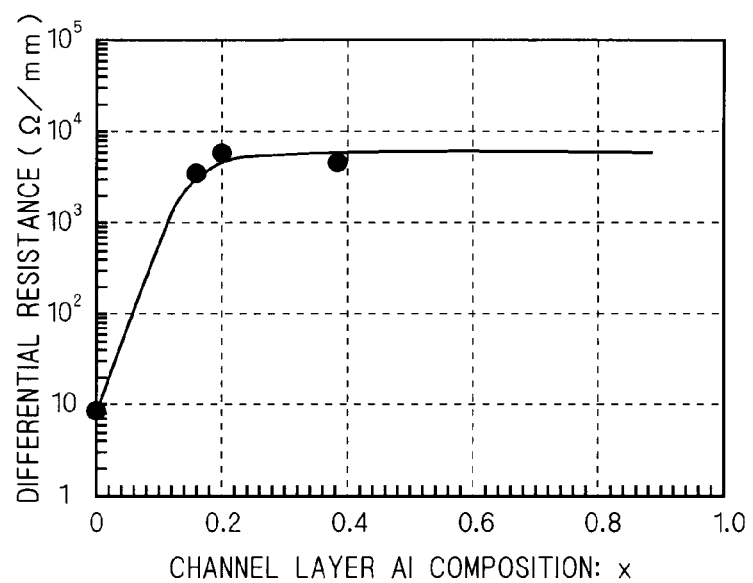
FIG. 41 is a drawing showing a result in which the differential resistance value in the case that a high concentration n-type impurities region is not formed is evaluated at a hetero-epitaxial substrate consisting of a plurality of the nitride semiconductors in which the Al composition of the channel layer is changed.

The result is shown in FIG. 41, in which the differential resistance value in the case that the high concentration n-type impurities region 106 shown in FIG. 21 is not formed is evaluated at the hetero-epitaxial substrate consisting of a plurality of nitride semiconductors in which the Al composition x of the channel layer 103 is varied. The evaluated Al compositions x of the channel layer 103 on the substrate are four values of 0, 0.16, 0.2, and 0.38. Moreover, the Al composition y of the barrier layer 104 is set to a larger value than the Al composition x in the case of any values of the Al composition x.

Figure 42:
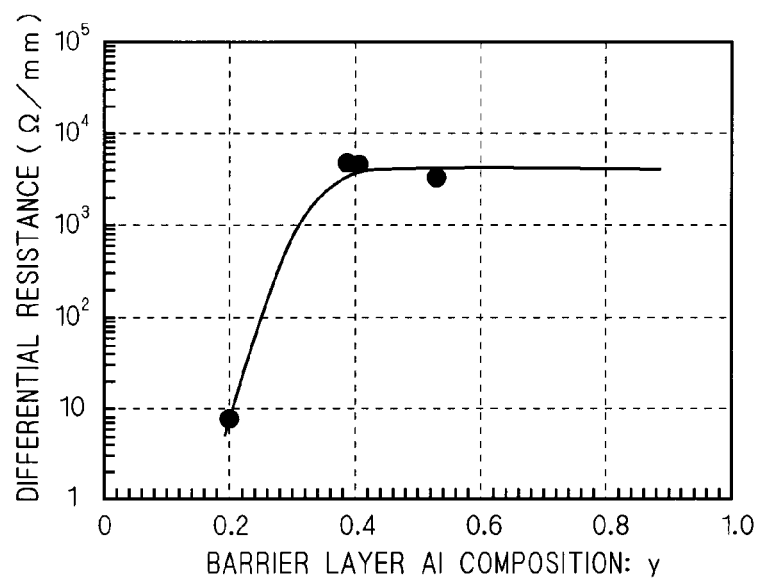
FIG. 42 is a drawing showing a result in which the differential resistance value in the case that a high concentration n-type impurities region is not formed is evaluated at a hetero-epitaxial substrate consisting of a plurality of the nitride semiconductors in which the Al composition of the barrier layer is changed.

Further, FIG. 42 is a drawing showing a result in which the differential resistance value in the case that the high concentration n-type impurities region 106 is not formed is evaluated at a hetero-epitaxial substrate consisting of a plurality of the nitride semiconductors in which the Al composition y of the barrier layer 104 is varied. The evaluated Al compositions y of the barrier layer 104 on the substrate are four values of 0.2, 0.39, 0.4, and 0.53. In this time, the Al composition x of the channel layer 103 corresponding to each Al composition y of the barrier layer 104 is set to a smaller value than the Al composition y.

The drain current hardly flows as the differential resistance value is larger, and therefore it can be said that a large output cannot be obtained even if it is operated as a transistor in any of the cases of FIGS. 41 and 42.

It is found from FIG. 41 that the differential resistance value is about 3 digits larger compared with the case that the Al composition x is 0 in the case that the Al composition x of the channel layer 103 is at least 0.16 or more. That is, it is said that the differential resistance becomes extremely high in the case that the Al composition x of the channel layer 103 is at least 0.16 or more.

It is found from FIG. 42 that the differential resistance value is about 3 digits larger compared with the case that the Al composition y is 0.2 also in the case that the Al composition y of the barrier layer 104 is at least 0.39 or more. That is, it is said that the differential resistance becomes extremely high also in the case that the Al composition y of the barrier layer 104 is at least 0.39 or more.

Of course, the differential resistance can become extremely large also in the case that the Al composition x of the channel layer 103 is at least 0.16 or more and that the Al composition y of the barrier layer 104 is at least 0.39 or more.

Figure 43:
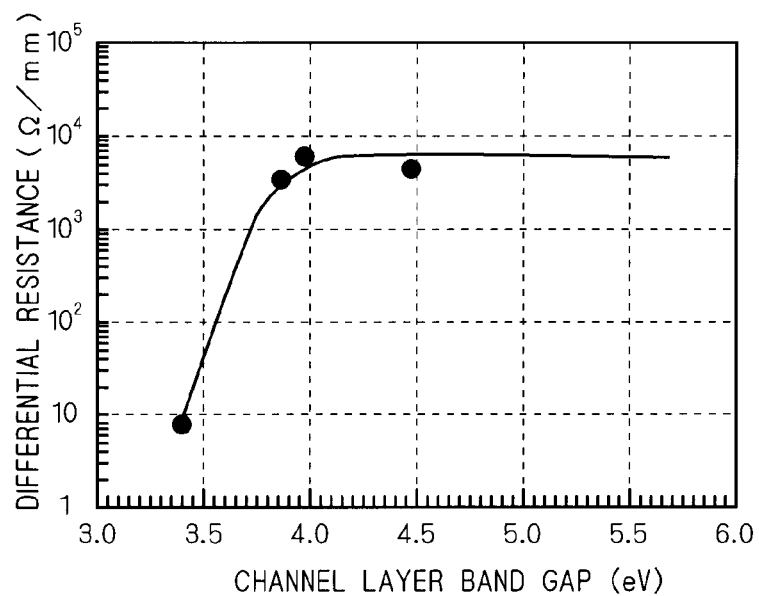
FIG. 43 is a drawing corresponding to the case that the x-axis of FIG. 22 is changed to the size of the band gap obtained from the Al composition in FIG. 22.
Figure 44:
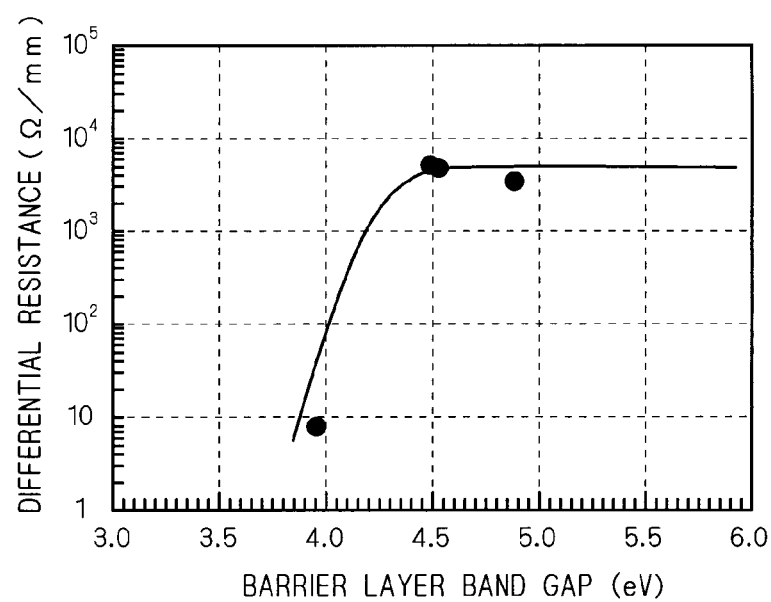
FIG. 44 is a drawing corresponding to the case that the x-axis of FIG. 23 is changed to the size of the band gap obtained from the Al composition in FIG. 23.

Further, FIGS. 43 and 44 are drawings corresponding to the case that the x-axis of each drawing of FIGS. 41 and 42 is changed to a size of the band gap obtained from the Al compositions.

It is understood from FIG. 43 that the differential resistance increases remarkably from the case that the band gap of the channel layer 103 is 3.8 eV or more.

Further, it is understood from FIG. 44 that the differential resistance value increases largely from the case that the band gap of the barrier layer 104 is 4.5 eV or more.

Figure 22:
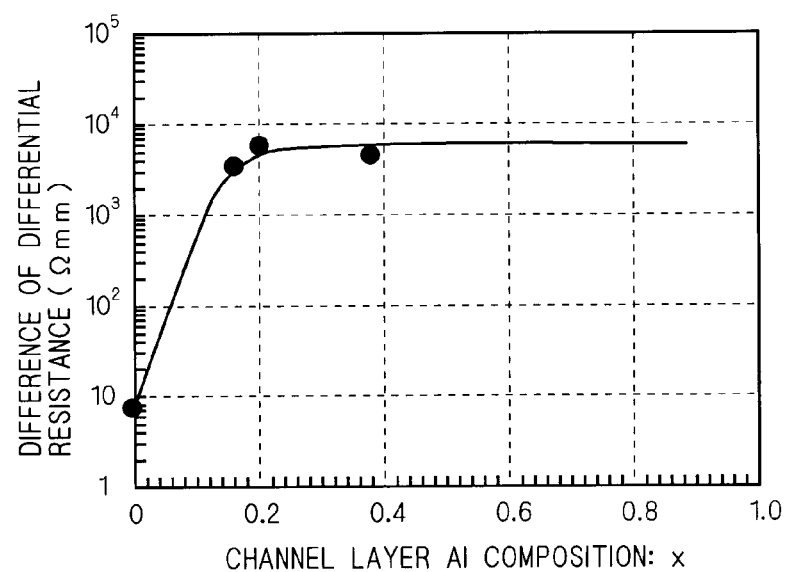
FIG. 22 is a drawing showing a channel layer Al composition dependency of the difference in the differential resistance in the case that a high concentration n-type impurities region is formed and the case that it is not formed.

Furthermore, a result of evaluating the difference in the differential resistance in the case that the high concentration n-type impurities region 106 is not formed and the case that the high concentration n-type impurities region 106 is formed on the hetero-epitaxial substrate consisting of a plurality of nitride semiconductors in which the Al composition x of the channel layer 103 is varied is shown in FIG. 22. The evaluated Al compositions x of the channel layer 103 on the substrate are four values of 0, 0.16, 0.2, and 0.38 (moreover, the Al composition y of the barrier layer 104 is set to be a larger value than the Al composition x in the case of any Al composition x values).

Figure 23:
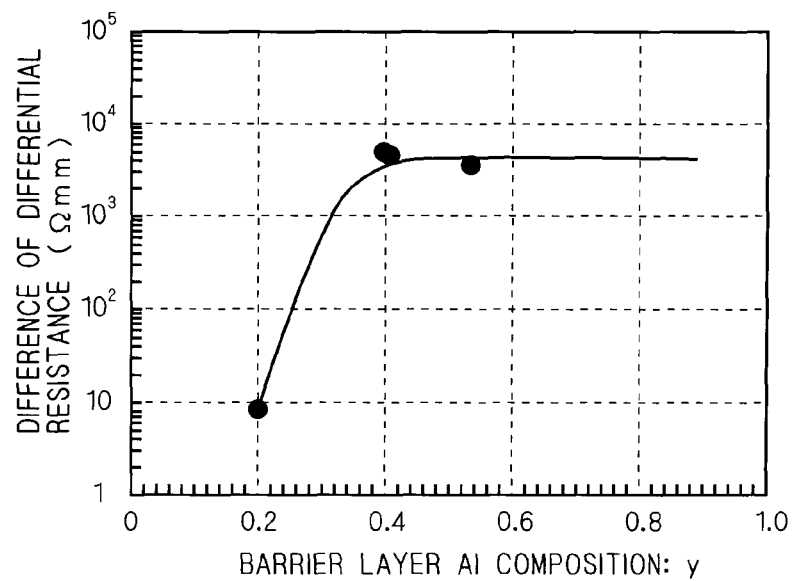
FIG. 23 is a drawing showing a barrier layer Al composition dependency of the difference in the differential resistance in the case that a high concentration n-type impurities region is formed and the case that it is not formed.

Furthermore, a result of evaluating the difference in the differential resistance in the case that the high concentration n-type impurities region 106 is not formed and the case that the high concentration n-type impurities region 106 is formed on the hetero-epitaxial substrate consisting of a plurality of nitride semiconductors in which the Al composition y of the barrier layer 104 is varied is shown in FIG. 23. The evaluated Al compositions of the barrier layer 104 on the substrate are four values of 0.2, 0.39, 0.4, and 0.53 (the Al composition x of the channel layer 103 corresponding to each Al composition y of the barrier layer 104 is set to be a smaller value than the corresponding Al composition y).

It is said that the effect of the high concentration impurities region 106 (making the resistance of the source/drain electrodes 107 low) is as large as the difference in the differential resistance in the case that the high concentration n-type impurities region 106 is not formed and the case that it is formed is larger in any cases of FIGS. 22 and 23.

It is found from FIG. 22 that the differential resistance value is about 3 digits larger compared with the case that the Al composition x is 0 in the case that the Al composition x of the channel layer 103 is at least 0.16 or more. That is, it is said that the effect of providing the high concentration n-type impurities region 106 in which the impurity concentration is $1 \times 10^{18}$ cm$^{-3}$ or more (making the resistance of the source/drain electrodes 107 low) becomes extremely large in the case that the Al composition x of the channel layer 103 is at least 0.16 or more.

It is found from FIG. 23 that the differential resistance value is about 3 digits larger compared with the case that the Al composition y is 0.2 also in the case that the Al composition y of the barrier layer 104 is at least 0.39 or more. That is, it is said that the effect of providing the high concentration n-type impurities region 106 in which the impurity concentration is $1 \times 10^{18}$ cm$^{-3}$ or more becomes extremely large also in the case that the Al composition y of the barrier layer 104 is at least 0.39 or more.

Of course, the effect of providing the high concentration n-type impurities region 106 in which the impurity concentration is $1 \times 10^{18}$ cm$^{-3}$ or more becomes extremely large also in the case that the Al composition x of the channel layer 103 is at least 0.16 or more and that the Al composition y of the barrier layer 104 is at least 0.39 or more.

Figure 24:
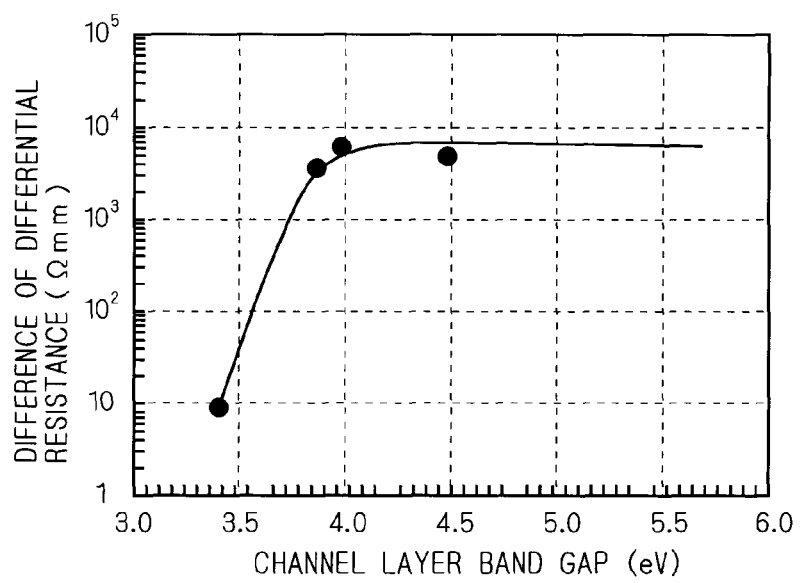
FIG. 24 is a drawing showing a channel layer band gap dependency of the difference in the differential resistance in the case that a high concentration n-type impurities region is formed and the case that it is not formed.
Figure 25:
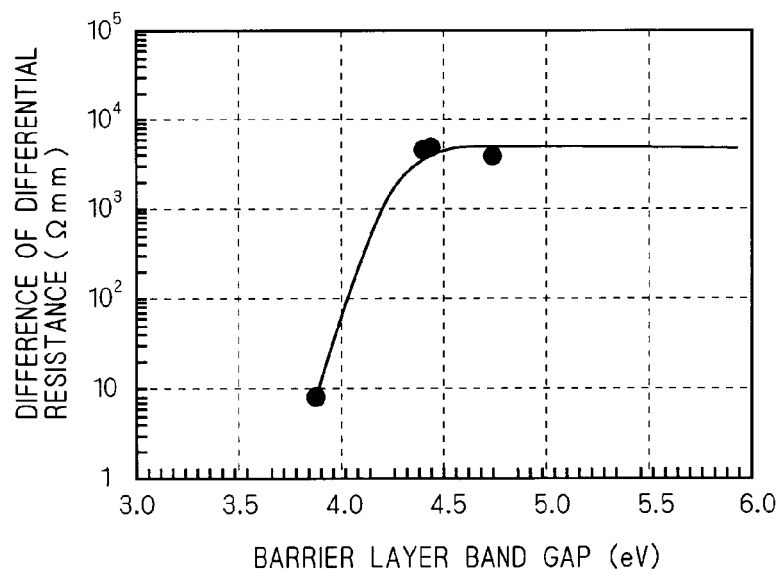
FIG. 25 is a drawing showing a barrier layer band gap dependency of the difference in the differential resistance in the case that a high concentration n-type impurities region is formed and the case that it is not formed.

Further, FIGS. 24 and 25 are drawings of the case that x axes of drawings of FIGS. 22 and 23 are made to the size of the band gap obtained from the Al compositions.

It is understood from FIG. 24 that the effect of the high concentration n-type impurities region 106 in which the impurity concentration is $1 \times 10^{18}$ cm$^{-3}$ or more becomes remarkable from the case that the band gap of the channel layer 103 is 3.8 eV or more.

Further, it is understood from FIG. 25 that the effect of the high concentration n-type impurities region 106 in which the impurity concentration is $1 \times 10^{18}$ cm$^{-3}$ or more becomes large from the case that the band gap of the barrier layer 104 is 4.5 eV or more.

As above, the typical conditions are described in Embodiment 4 (FIG. 19). However, the same effect can be obtained under the conditions shown in each Modified Example described below.

Modified Example 1

A substrate such as Si, sapphire, GaN, and AlN may be used in place of the semi-insulating SiC substrate in FIG. 19.

Modified Example 2

The channel layer 103 and the barrier layer 104 shown in FIG. 19 are not necessarily configured with Al$_x$Ga$_{1-x}$N (0.16≦x≦1) and Al$_y$Ga$_{1-y}$N (0.39≦y≦1, x<y) as shown in FIG. 19 as long as the band gap of the second nitride semiconductor configuring the barrier layer 104 is larger than the band gap of the first nitride semiconductor configuring the channel layer 103, the band gap of the material configuring the channel layer 103 is 3.8 eV or more, and the band gap of the material configuring the barrier layer 104 is 4.5 eV or more. For example, it may be a layer in which the channel layer 103 is configured with In$_a$Al$_b$Ga$_{1-a-b}$N or in which the barrier layer 104 is configured with In$_c$Al$_d$Ga$_{1-c-d}$N.

Modified Example 3

In the case that the channel layer 103 and the barrier layer 104 are configured with a compound consisting of at least two elements containing N in the three elements of Al, Ga, and N as the structures of the channel layer 103 and the barrier layer 104 in the structure of Modified Example 2 (the structure shown in FIG. 19 is one of its examples, and for example, when the Al composition y is 1, the barrier layer 104 becomes AlN, on the other hand, when both the compositions a and b are 0 in the case of Modified Example 2, the channel layer 103 becomes GaN.), a large polarization effect is generated in the barrier layer 104, and therefore a high concentration two-dimensional electron gas can be generated at the hetero-interface. Therefore, it is said that the structure has an advantage of making the hetero-junction field effect transistor have high current and high output, and is a preferable structure.

Modified Example 4

The higher the electric breakdown field of the semiconductor material used in the channel layer 103, the higher its breakdown voltage becomes in the hetero-junction field effect transistor. Because the higher the Al composition, the larger the band gap of Al$_b$Ga$_{1-b}$N is and the higher the electric breakdown field is, Al$_x$Ga$_{1-x}$N used in the channel layer 103 is preferably one having a higher Al composition x (x is near 1). Further, because it becomes more difficult for the gate leakage current flowing from the gate electrode 108 into the hetero-interface via the barrier layer 104 to flow as the band gap of the semiconductor material used in the barrier layer 104 is larger, one having a higher Al composition y is preferable as the same for Al$_y$Ga$_{1-y}$N used as the barrier layer 104. Especially, in the case of using AlN (the case of that the Al composition y of Al$_y$Ga$_{1-y}$N is 1), the gate leakage current can be most reduced.

Modified Example 5

The channel layer 103 and the barrier layer 104 shown in Modified Examples 2 to 4 do not necessarily have a structure consisting of one layer of the same composition, and may be a multi-layered film consisting of a few layers different of In composition, Al composition, and Ga composition (different a, b, c, and d of $In_aAl_bGa_{1-a-b}N$ and $In_cAl_dGa_{1-c-d}N$). Further, n-type or p-type impurities may be contained in the above-described nitride semiconductor of these layers.

Modified Example 6

Figure 26:
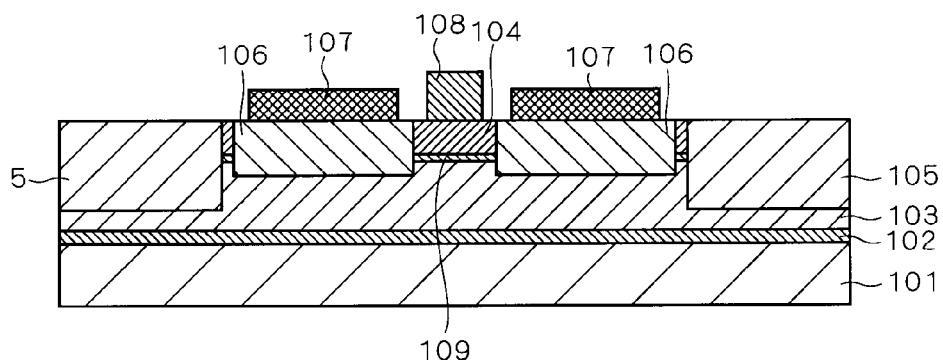
FIG. 26 is a vertical cross-sectional drawing showing a configuration of a hetero-junction field effect transistor consisting of a nitride semiconductor according to Modified Example 6 of Embodiment 4 of the present invention.

A thin spacer layer 109 of 0.1 nm to 5 nm thickness, consisting of InN, GaN, or AlN, may be inserted between the channel layer 103 and the barrier layer 104 in FIG. 19 (refers to FIG. 26). By inserting such two-dimensional semiconductor, the electron mobility at the hetero interface is improved, and a large drain current can flow.

Modified Example 7

Figure 27:
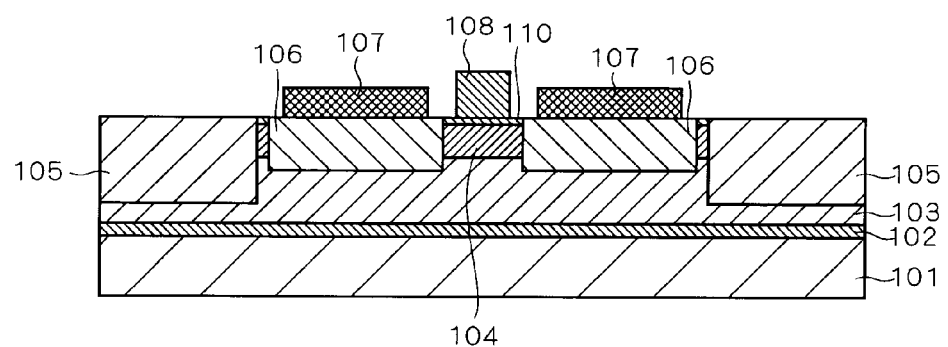
FIG. 27 is a vertical cross-sectional drawing showing a configuration of a hetero-junction field effect transistor consisting of a nitride semiconductor according to Modified Example 7 of Embodiment 4 of the present invention.

The barrier layer 104 in FIG. 19 may be covered with a thin cap layer 110 of 0.1 nm to 50 nm thickness, consisting of GaN (refers to FIG. 27). By making such a structure, the Schottky barrier of the gate electrode 108 becomes high, and the breakdown voltage can be made high.

Modified Example 8

The source/drain electrodes 107 in FIG. 19 are not necessarily Ti/Al, and may be formed with a metal such as Ti, Al, Nb, Hf, Zr, Sr, Ni, Ta, Au, Mo, and W or a multi-layered film constituted from these metals.

Modified Example 9

The concentration of the n-type impurities in the high concentration n-type impurities region 106 immediately below the source/drain electrodes 107 described in FIG. 19 is not necessarily constant, and the concentration of the n-type impurities may be distributed. Especially, in the case of a structure in which the concentration of the n-type impurities is increased from the gate electrode 108 side toward the source/drain electrode 107 side, the electric field concentrated at the end of the drain electrode side of the gate electrode 108 during applying a high voltage to the drain electrode can be relaxed, and a high breakdown voltage can be realized.

Modified Example 10

Figure 28:
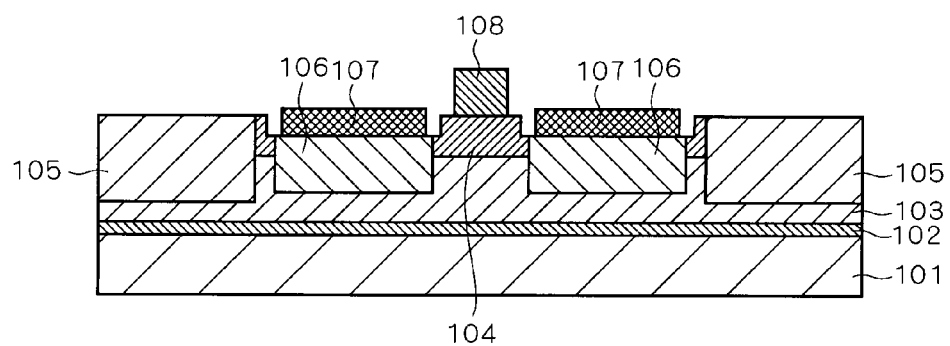
FIG. 28 is a vertical cross-sectional drawing showing a configuration of a hetero-junction field effect transistor consisting of a nitride semiconductor according to Modified Example 10 of Embodiment 4 of the present invention.

The high concentration n-type impurities region 106 immediately below the source/drain electrodes 107 in FIG. 19 may configure that a part of it is removed (refer to FIG. 28). By making such a structure, the contact resistance can be made lower.

Modified Example 11

The gate electrode 108 described in FIG. 19 is not necessarily configured with Ni/Au, and may be formed with a metal such as Ti, Al, Pt, Au, Ni, and Pd, a silicide such as IrSi, PtSi, and NiSi$_2$, or a nitride metal such as TiN and WN, or a multi-layered film configured from these.

Modified Example 12

There is no necessity that the gate electrode 108 in FIG. 19 is directly contacting to the barrier layer 104, and may be formed via the insulating film 111 such as $AlGa_nO_o$, $GaO_p$, $AlO_q$, $SiN_r$, $SiO_s$, $HfO_t$, and $TiO_u$ (refer to FIG. 29). By making such a structure, the gate leakage current can be reduced.

Modified Example 13

The structure of the gate electrode 108 in FIG. 19 may be a recessed gate structure (refer to FIG. 30) that forms the gate electrode 108 inside the region in which a part of the barrier layer 104 between the source/drain electrodes 107 is etched, not the planar structure as shown in FIG. 19. By making such a structure, making a reduced source resistance can be achieved in comparison with the case of the planar structure.

Modified Example 14

The structure of the gate electrode 108 in FIG. 19 may be an embedded gate structure (refer to FIG. 31) that forms the gate electrode 108 so as to cover the region in which a part of the barrier layer 104 between the source/drain electrodes 107 is etched, not the planar structure as shown in FIG. 19. By making such a structure, the source resistance can be reduced in comparison with the case of the planar structure, and the electric field concentrated at the edge part of the drain electrode side of the gate electrode 108 during a high voltage operation can be relaxed, and the breakdown voltage can be made high.

Modified Example 15

There is no necessity of adapting the above-described structures individually, and it may be a structure in which each is combined.

Embodiment 5

Figure 45:
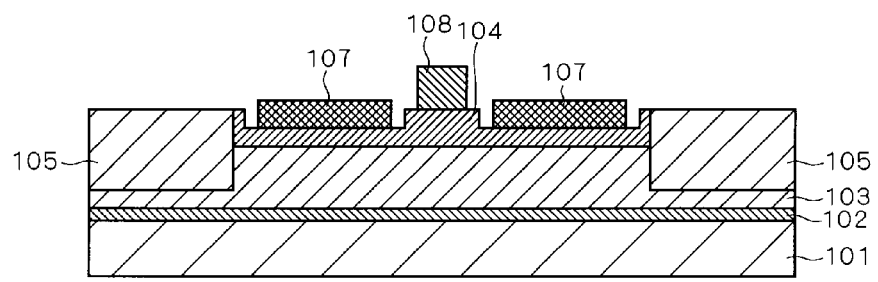
FIG. 45 is a vertical cross-sectional drawing showing one example of a hetero-junction field effect transistor consisting of a nitride semiconductor according to Embodiment 5.

FIG. 45 is a vertical cross-sectional drawing showing one example of the hetero-junction field effect transistor consisting of a nitride semiconductor according to the present embodiment. The elements in FIG. 45 having the same reference numbers as the reference numbers in FIGS. 19 to 31 show the same or corresponding elements.

As shown in FIG. 45, both a part immediately below the source/drain electrodes 107 in the barrier layer 104 and its peripheral part are removed, and because of that, the thickness is thinner than at least a part of the barrier layer 104 located immediately below the gate electrode 108. Because the distance between the source/drain electrodes 107 and the region where the two-dimensional electron gas that becomes a carrier is formed in the hetero-junction field effect transistor can be made short also by making such a structure, the resistance can be reduced, and as a result, a large drain current can be obtained, and a large output can be obtained when operating it as a transistor.

Especially, as shown in FIG. 41 in Embodiment 4, because the differential resistance is larger by about 3 digits in the case that the Al composition x of the channel layer 103 is at least 0.16 or more compared with the case that the Al composition x is 0, it is said that it is effective to adapt a structure shown in FIG. 45 in the case that the Al composition x of the channel layer 103 is at least 0.16 or more. That is, the differential resistance increases to about 3 digits in the structure excluding the high concentration n-type impurities region 106 from the structure in FIG. 19 in the case that the Al composition x of the channel layer 103 is at least 0.16 or more. However, such increase of the differential resistance can be reduced remarkably with the characteristic structure in FIG. 45 (in that the distance between the source/drain electrodes 107 and the region where the two-dimensional electron gas is formed becomes shorter than in the case of the structure in FIG. 19 because it has a structure in which a part immediately below the source/drain electrodes 107 in the barrier layer 104 is bored in and becomes thin), and a structure in which a large drain current can be obtained can be realized as in the structure in FIG. 19.

Further, because the differential resistance is larger by about 3 digits also in the case that the Al composition y of the barrier layer 104 is at least 0.39 or more compared with the case that the Al composition y is 0.2 as shown in FIG. 42 in Embodiment 4, it is said that it is effective to similarly adapt a structure shown in FIG. 45 in the case that the Al composition y of the barrier layer 104 is at least 0.39 or more.

Of course, it is said that the structure shown in FIG. 45 is effective also in the case that the Al composition x of the channel layer 103 is at least 0.16 or more and that the Al composition y of the barrier layer 104 is at least 0.39 or more.

Further, it is said that the structure shown in FIG. 45 is effective also in the case that the band gap of the channel layer 103 is 3.8 eV or more or in the case that the band gap of the barrier layer 104 is 4.5 eV or more as shown in FIGS. 43 and 44 in Embodiment 4.

As above, the typical conditions are described in Embodiment 5 (FIG. 45). However, the same effect can be obtained under the above-described conditions shown in each modified example in Embodiment 4 or under the conditions shown in each Modified Example described below.

Modified Example 1

The top face of the region where the barrier layer 104 under the source/drain electrodes has removed is not necessarily a larger region than the bottom face of the source/drain electrodes 107, and it is fine as long as at least a part of the region of the barrier layer 104 located immediately below the source/drain electrodes 107 is removed. Further, the removed region is not necessarily only the barrier layer 104, and a part of the region of the channel layer 103 immediately below the barrier layer 104 may be removed in addition to the barrier layer 104.

Modified Example 2

Figure 46:
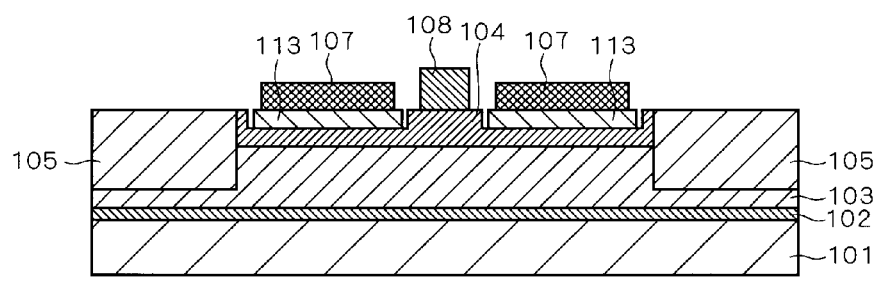
FIG. 46 is a vertical cross-sectional drawing showing one example of a hetero-junction field effect transistor consisting of a nitride semiconductor according to Modified Example 2 of Embodiment 5.

A contact layer 113 consisting of a material having a smaller band gap than that of the material forming the barrier layer 104 doped with n-type impurities may be formed between the source/drain electrodes 107 and the barrier layer 104 as shown in FIG. 46. Because a parasitic resistance generated between the source/drain electrodes 107 and the semiconductor can be reduced also by making such a structure, a large drain current can be obtained, and a large output can be obtained during operating it as a transistor.

Modified Example 3

There is no necessity of adapting the above-described structures shown in Embodiment 4 or each of its Modified Examples and the above-described structures described in the present embodiment or each of its Modified Examples 1 and 2 individually, and it may be a structure in which each is combined. For example, a modified example may be realized in which the high concentration n-type impurities region 106 shown in FIG. 19 is applied to the structure shown in FIG. 45 or FIG. 46.

Embodiment 6

Figure 33:
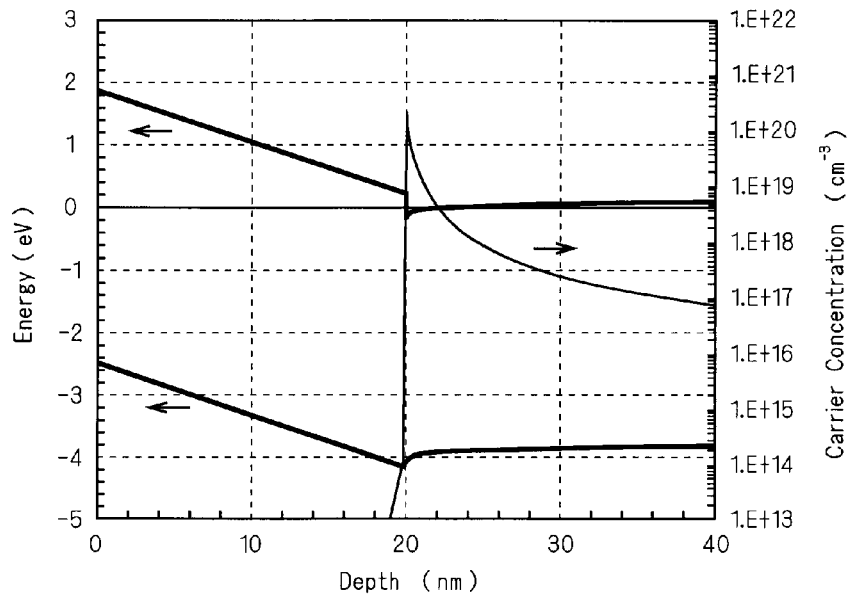
FIG. 33 is a drawing showing a result in which the energy band structure and the carrier concentration in the depth direction of the barrier layer and the channel layer in the case that the Al composition x of the channel layer is made to be 0.2, the Al composition y of the barrier layer is made to be 0.4, and the thickness of the barrier layer is made to be 20 nm were derived by calculation.

FIG. 33 is a drawing showing the result in which the energy band structure and the carrier concentration in the depth direction of the barrier layer 104 and the channel layer 103 are derived by calculation in the case that the Al composition x of the channel layer 103 is made to be 0.2, the Al composition y of the barrier layer 104 is made to be 0.4, and the thickness of the barrier layer is made to be 20 nm in the structure shown in FIG. 19. The calculation is carried out by solving Poisson's equation and Schrödinger's equation self-consistently. The two-dimensional electron gas (2 DEG) at high concentration ($2E+20$ cm$^{-3}$) is generated at the hetero-interface in the case that the thickness of the barrier layer 104 is 20 nm as shown in FIG. 33, and a normally-on transistor can be obtained in the case of producing a transistor on an epitaxial substrate of such structure.

Figure 34:
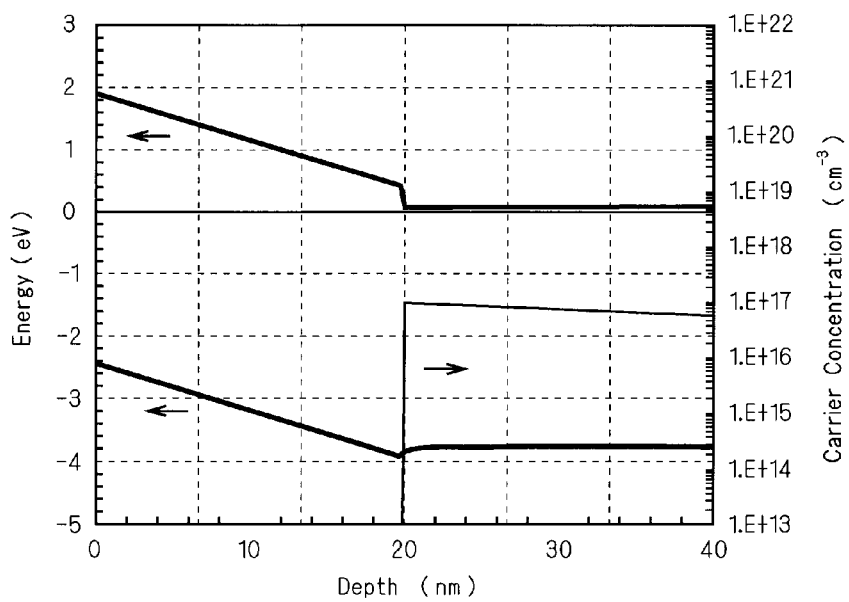
FIG. 34 is a drawing showing a result in which the energy band structure and the carrier concentration in the depth direction of the barrier layer and the channel layer in the case that the Al composition x of the channel layer is made to be 0.2, the Al composition y of the barrier layer is made to be 0.4, and the thickness of the barrier layer is made to be thin to 6 nm, were derived by calculation.

On the other hand, FIG. 34 is a drawing showing the result in which the energy band structure and the carrier concentration in the depth direction of the barrier layer 104 and the channel layer 103 are derived by the similar calculation in the case that the Al composition x of the channel layer 103 is made to be 0.2, the Al composition y of the barrier layer 104 is made to be 0.4, and the thickness of the barrier layer 104 is made to be thinner to 6 nm from 20 nm. The two-dimensional electron gas (2 DEG) is not generated at the hetero-interface in this case, and a normally-on transistor can be obtained in the case of producing a transistor on an epitaxial substrate of such structure.

A normally-off transistor in which the threshold becomes positive is desired to secure safety at an abnormal time in the case of using the transistor as a power device such as a switching element. In the case of the hetero-junction field effect transistor consisting of a nitride semiconductor, the state as shown in FIG. 34, that is, the state in which the two-dimensional electron gas is not generated at the hetero-interface in the state in which a voltage is not applied to the gate electrode 108, can be realized by controlling the thickness of the barrier layer 104 and a mixed crystal ratio (for example, Al composition in the case of AlGaN) of atoms constituting the channel layer 103 and the barrier layer 104, and a normally-off transistor can be produced by making such a structure.

Embodiment 7

Manufacturing Method of Embodiment 4

FIGS. 35 to 40 are vertical cross-sectional drawings showing one example of a manufacturing process of the hetero-junction field effect transistor consisting of a nitride semiconductor having a structure showing FIG. 19. The elements in these drawings having the same reference numbers as the reference numbers in FIGS. 19 to 31 show the same or corresponding elements.

Figure 35:
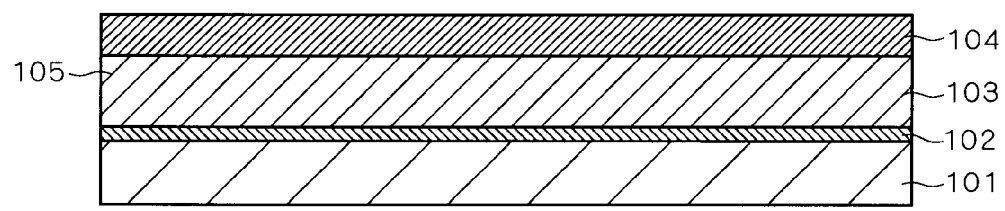

First, as shown in FIG. 35, each of the buffer layer 102, the channel layer ($Al_xGa_{1-x}N$) 3, and the barrier layer ($Al_yGa_{1-y}N$) 4 is epitaxial grown in order from the bottom on the substrate 1 by applying an epitaxial growth method such as a MCVD method and an MBE method. Moreover, the substrate having the structure shown in FIG. 35 may be bought from a substrate maker, etc.

Figure 36:
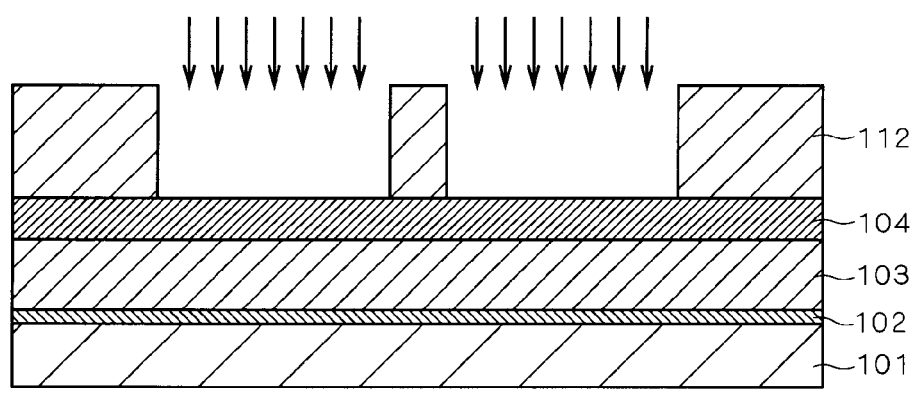

Next, as shown in FIG. 36, ions that becomes n-type such as Si are implanted in a desired region in the nitride semiconductor with the condition of an implantation dosage $1 \times 10^{13}$ $cm^{-2}$ to $1 \times 10^{16}$ $cm^{-2}$ and an implantation energy 10 keV to 1000 keV by using a resist pattern, etc. as a mask 112 by an ion implantation method, etc.

After that, the high concentration n-type impurities region 106 shown in FIG. 37 is formed by a thermal treatment at a temperature of 800° C. to 1500° C. by using a RTA (Rapid Thermal Annealing) method, etc. and activating the doped ions.

Next, as shown in FIG. 38, the source/drain electrodes 107 consisting of a metal such as Ti, Al, Nb, Hf, Zr, Sr, Ni, Ta, Au, Mo, and W or a multi-layered film constituted from these metals are formed is formed by depositing these by using a vapor deposition method or a sputtering method and then using a lift-off method, etc.

Figure 39:
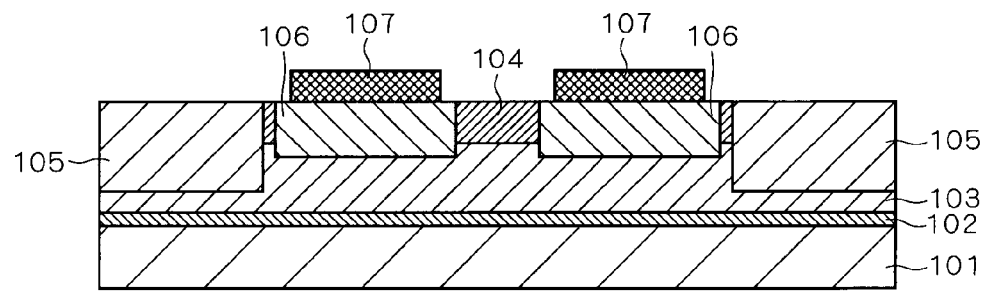

Next, as shown in FIG. 39, the element separation region 105 is formed in the channel layer 103 and the barrier layer 104 other than the region where the transistor is produced by using an ion implantation method, an etching method, etc. An ion implantation method is shown in FIG. 39.

Figure 40:
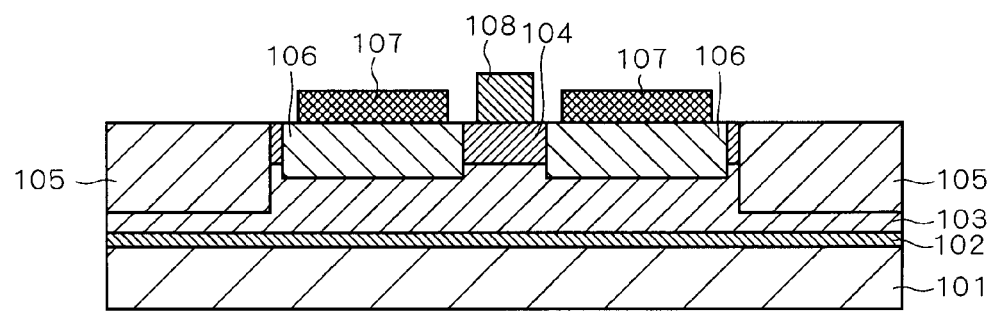

After that, as shown in FIG. 40, the gate electrode 108 consisting of a metal such as Ti, Al, Pt, Au, Ni, and Pd, a silicide such as IrSi, PtSi, and $NiSi_2$, a nitride metal such as TiN and WN, or a multi-layered film constituting from these is formed by depositing these by using a vapor deposition method or a sputtering method and then using a lift-off method, etc.

The hetero-junction field effect transistor having the structure shown in FIG. 19 can be produced with the above methods. Only a necessary and minimum process for operating as a transistor is described above. However, the product that is finally completed via a process of forming a protective film, wirings, a via-hole, etc. is used as a semiconductor device.

Moreover, the typical conditions are described above. However, The hetero-junction field effect transistor consisting of a nitride semiconductor having the effect of the present invention can be produced under the conditions shown in each Modified Example in the present Embodiment described below.

Modified Example 1

Various nitride semiconductor hetero-junction field effect transistors shown in Modified Examples 2 to 5 in Embodiment 1 can be produced by adjusting flow rate and pressure of trimethyl ammonium, trimethyl gallium, ammonia, etc. which are raw material gas of AlGaN, temperature, and time, and making the channel layer 103 and the barrier layer 104 to have a desired composition and film thickness at the growth of the channel layer 103 and the barrier layer 104 shown in FIG. 35.

Modified Example 2

The normally-off nitride semiconductor hetero-junction field effect transistors shown in Embodiment 5 can be produced by adjusting flow rate and pressure of trimethyl ammonium, trimethyl gallium, ammonia, etc. which are raw material gas of AlGaN, temperature and time, and making the channel layer 103 and the barrier layer 104 to have a desired Al composition and film thickness at the growth of the channel layer 103 and the barrier layer 104 shown in FIG. 35.

Modified Example 3

After growing the channel layer 103 shown in FIG. 35, growing a thin spacer layer 109 of 0.1 nm to 5 nm thickness comprising InN, GaN, or AlN, and then growing the barrier layer 104, the structure shown in Modified Example 6 (FIG. 26) in Embodiment 4 can be obtained.

Modified Example 4

After growing the barrier layer 104 shown in FIG. 35, and then growing a thin cap layer 110 of 0.1 nm to 50 nm thickness comprising GaN, the structure shown in Modified Example 7 (FIG. 27) in Embodiment 4 can be obtained.

Modified Example 5

The high concentration n-type impurities region 106 can be formed in which the n-type impurities concentration is distributed as shown in Modified Example 9 in Embodiment 4 by repeating the formation of a resist pattern 112 and the ion implantation shown in FIG. 36 several times by changing the resist pattern 112 and the implantation condition (implantation energy and implantation amount).

Modified Example 6

In the formation of the source/drain electrodes 107 in FIG. 38, a part or all of the barrier layer 104 immediately below the source/drain electrodes 107 and a part of the channel layer 103 are removed by using a dry etching method in which $Cl_2$ etc. is used, and then the source/drain electrodes 107 may be formed. The structure as shown in Modified Example 10 (FIG. 28) in Embodiment 4 can be obtained by such a method.

Modified Example 7

In the formation of the source/drain electrodes 107 in FIG. 38, a part or all of the barrier layer 104 immediately below the source/drain electrodes 107 and a part of the channel layer 103 are removed by using a dry etching method in which $Cl_2$ etc. is used, and then the source/drain electrodes 107 may be formed without performing the ion implantation step and the high-temperature heat treatment step shown in FIGS. 36 and 37 in Modified Example 6. The structure as shown in Embodiment 5 (FIG. 45) can be obtained by such a method.

Modified Example 8

In the formation of the source/drain electrodes 107 in FIG. 38, a part or all of the barrier layer 104 immediately below the source/drain electrodes 107 and a part of the channel layer 103 are removed by using a dry etching method in which $Cl_2$ etc. is used, a contact layer 113 consisting of a material having a smaller band gap than the barrier layer 104 of GaN, etc. doped with the n-type impurities is formed by using a MOCVD method, etc., and then the source/drain electrodes 107 may be formed without performing the ion implantation step and the high-temperature heat treatment step shown in FIGS. 36 and 37 in Modified Example 7 of the present embodiment. The structure as shown in Modified Example 2 (FIG. 46) in Embodiment 5 can be obtained by such a method.

Modified Example 9

Each three steps of the formation of the source/drain electrodes 107 shown in FIG. 38, the formation of the element separation region 105 shown in FIG. 39, and the formation of the gate electrode 108 shown in FIG. 40 are not necessarily performed in this order, and the order of the steps may be exchanged. For example, the element separation region 105 may be formed before forming the source/drain electrodes 107.

Modified Example 10

The field effect transistor having the structure shown in Modified Example 12 (FIG. 29) in Embodiment 4 is produced by depositing an insulation film 111 such as $AlGa_nO_o$, $GaO_p$, $AlO_q$, $SiN_r$, $SiO_s$, $HfO_t$, and $TiO_u$ by using a vapor deposition method, a plasma CVD method, etc. before forming the gate electrode 108 shown in FIG. 40, and then forming the gate electrode 108, the gate leakage current can be reduced, and the breakdown voltage between the gate and the source can be improved. Moreover, it is necessary to form wirings after removing a part of the source/drain electrodes 107 covered with the insulation film 111 by wet-etching with fluoric acid, etc. in order to finally use it as a semiconductor device.

Modified Example 11

Figure 31:
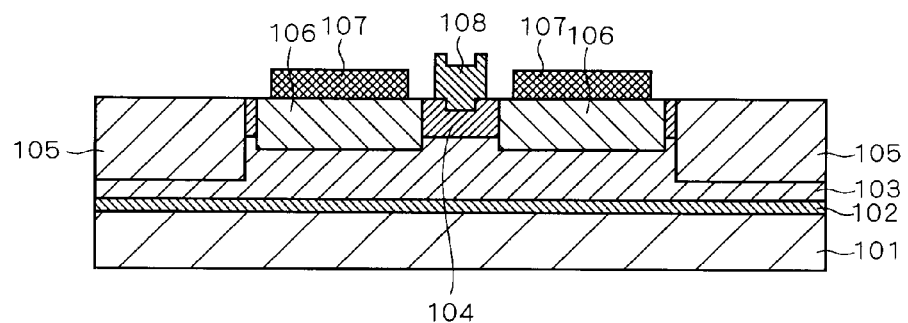
FIG. 31 is a vertical cross-sectional drawing showing a configuration of the hetero-junction field effect transistor consisting of a nitride semiconductor according to Modified Example 14 of Embodiment 4 of the present invention.

The hetero-junction field effect transistor having the structure shown in FIGS. 30 and 31 can be produced by removing a part of the barrier layer 104 between the source/drain electrodes 107 by using a dry-etching method etc. using $Cl_2$, etc. before forming the gate electrode 108 shown FIG. 40, forming a recess in advance, and then forming the gate electrode 108.

Modified Example 12

There is no necessity of adapting all the above-described manufacturing methods individually, and a manufacturing method where each is combined may be realized.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device of a hetero-junction field effect transistor, including:
    an $Al_xGa_{1-x}N$ channel layer with a composition ratio of Al being x (0<x<1) formed on a substrate,
    an $Al_yGa_{1-y}N$ barrier layer with a composition ratio of Al being y (0<y≦1) formed on said channel layer,
    an impurity region extending from a surface of said barrier layer opposing said channel layer into said channel layer,
    source/drain electrodes, and
    a gate electrode formed on said surface of said barrier layer, a concentration of impurities of the impurity region increasing from a side of the impurity region nearest the gate electrode to a side of the impurity region nearest one of the source/drain electrodes, wherein said composition ratio y is larger than said composition ratio x.

2. The semiconductor device as in claim 1, wherein said barrier layer is AlN.

3. The semiconductor device as in claim 1, wherein a thickness t (nm) of said barrier layer is made to be
    (1) a thickness equal to the t(x, y) value in Table 1 or more in a case that said composition ratio x and said composition ratio y are described in said Table 1,
    (2) a thickness equal to [x2×t(x1, y)−x1×t(x2, y2)+{t(x2, y2)−t(x1, y)}×x]/0.05=t(x, y) or more obtained from t(x2, y2) in said Table 1 and t(x1, y)=[y2×t(x1, y1)−y1×t(x1, y2)+{t(x1, y2)−t(x1, y1)}×y]/0.05 obtained from t(x1, y1) and t(x1, y2) in said Table 1, in which a maximum value described in said Table 1 in a range that is 0.05 step smaller than said composition ratio x is x1, a value in which 0.05 is added to said x1 is x2, a maximum value described in said Table 1 in a range that is 0.05 step smaller than said composition ratio y is y1, and a value in which 0.05 is added to said y1 is y2, in a case that said composition ratio x and said composition ratio y are not described in said Table 1 and have a relationship of x+0.05≦y<x+0.1, and
    (3) a thickness equal to [y2×t(x, y1)−y1×t(x, y2)+{t(x, y2)−t(x, y1)}×y]/0.05=t(x, y) or more obtained from t(x, y1)=[x2×t(x1, y1)−x1×t(x2, y1)+{t(x2, y1)−t(x1, y1)}×x]/0.05 obtained from t(x1, y1) and t(x2, y1) in said Table 1 and t(x, y2)=[x2×t(x1, y2)−x1×t(x2, y2)+{t(x2, y2)−t(x1, y2)}×x]/0.05 obtained from t(x1, y2) and t(x2, y2) in said Table 1, in which a maximum value described in said Table 1 in a range that is 0.05 step smaller than said composition ratio x is x1, a value in which 0.05 is added to said x1 is x2, a maximum value described in said Table 1 in a range that is 0.05 step smaller than said composition ratio y is y1, and a value in which 0.05 is added to said y1 is y2, in a case that said composition ratio x and said composition ratio y are not described in said Table 1 and have a relationship of y≧x+0.1

TABLE 1

| Thickness of Barrier Layer t (nm) | | Al Composition Ratio y of Barrier Layer | | | | | | | | | |
|---|---|---|---|---|---|---|---|---|---|---|---|
| | | 0.05 | 0.1 | 0.15 | 0.2 | 0.25 | 0.3 | 0.35 | 0.4 | 0.45 | 0.5 | 0.55 |
| Al Composition Ratio x of Channel Layer | 0 | 11 | 6 | 4.5 | 3 | 2.5 | 2 | 1.5 | 1 | 1 | 1 | 1 |
| | 0.05 | | 13 | 7 | 5.5 | 5.25 | 3 | 2.25 | 1.5 | 1.5 | 1.5 | 1.25 |
| | 0.1 | | | 15 | 8 | 8 | 4 | 3 | 2 | 2 | 2 | 1.5 |
| | 0.15 | | | | 16 | 8 | 6.5 | 5 | 3.5 | 3 | 2.5 | 2 |
| | 0.2 | | | | | 18 | 9 | 7 | 5 | 4 | 3 | 2.5 |
| | 0.25 | | | | | | 19 | 10 | 8 | 6 | 4 | 3.25 |
| | 0.3 | | | | | | | 21 | 11 | 8 | 5 | 4 |
| | 0.35 | | | | | | | | 22 | 11 | 8.5 | 6.5 |
| | 0.4 | | | | | | | | | 24 | 12 | 9 |
| | 0.45 | | | | | | | | | | 25 | 12 |
| | 0.5 | | | | | | | | | | | 26 |
| | 0.55 | | | | | | | | | | | |
| | 0.6 | | | | | | | | | | | |
| | 0.65 | | | | | | | | | | | |
| | 0.7 | | | | | | | | | | | |
| | 0.75 | | | | | | | | | | | |
| | 0.8 | | | | | | | | | | | |

TABLE 1-continued 0.85
0.9
0.95

| Thickness of Barrier Layer t | | Al Composition Ratio y of Barrier Layer | | | | | | | | |
|---|---|---|---|---|---|---|---|---|---|---|
| (nm) | | 0.6 | 0.65 | 0.7 | 0.75 | 0.8 | 0.85 | 0.9 | 0.95 | 1 |
| Al Composition Ratio x of Channel Layer | 0 | 1 | 1 | 1 | 1 | 1 | 1 | 1 | 1 | 1 |
| | 0.05 | 1 | 1 | 1 | 1 | 1 | 1 | 1 | 1 | 1 |
| | 0.1 | 1 | 1 | 1 | 1 | 1 | 1 | 1 | 1 | 1 |
| | 0.15 | 1.5 | 1.5 | 1.5 | 1.25 | 1 | 1 | 1 | 1 | 1 |
| | 0.2 | 2 | 2 | 2 | 1.5 | 1 | 1 | 1 | 1 | 1 |
| | 0.25 | 2.5 | 2.25 | 2 | 1.75 | 1.5 | 1.25 | 1 | 1 | 1 |
| | 0.3 | 3 | 2.5 | 2 | 2 | 2 | 1.5 | 1 | 1 | 1 |
| | 0.35 | 4.5 | 3.75 | 3 | 2.75 | 2.5 | 2 | 1.5 | 1.5 | 1.5 |
| | 0.4 | 6 | 5 | 4 | 3.5 | 3 | 2.5 | 2 | 2 | 2 |
| | 0.45 | 9.5 | 7.25 | 5 | 4.25 | 3.5 | 3 | 2.5 | 2.25 | 2 |
| | 0.5 | 13 | 9.5 | 6 | 5 | 4 | 3.5 | 3 | 2.5 | 2 |
| | 0.55 | 27 | 13 | 10 | 7.75 | 5.5 | 4.5 | 3.5 | 3 | 2.5 |
| | 0.6 | | 28 | 14 | 10.5 | 7 | 5.5 | 4 | 3.5 | 3 |
| | 0.65 | | | 29 | 14 | 11 | 8.25 | 5.5 | 4.75 | 4 |
| | 0.7 | | | | 30 | 15 | 11 | 7 | 6 | 5 |
| | 0.75 | | | | | 31 | 15 | 11.5 | 9 | 6.5 |
| | 0.8 | | | | | | 32 | 16 | 12 | 8 |
| | 0.85 | | | | | | | 33 | 16 | 12.5 |
| | 0.9 | | | | | | | | 34 | 17 |
| | 0.95 | | | | | | | | | 35. |

4. A semiconductor device, provided with:
a hetero-junction field effect transistor in which a channel layer comprising a first nitride semiconductor and a barrier layer comprising a second nitride semiconductor having a larger band gap than that of said first nitride semiconductor form a hetero-junction, wherein the band gap of said first nitride semiconductor in said channel layer is 3.8 eV or more, and a high concentration n-type impurity region having an impurity concentration of $1 \times 10^{18}$ cm$^{-3}$ or more is formed immediately below source/drain electrodes of said hetero-junction field effect transistor.

5. The semiconductor device as in claim 4, wherein said second nitride semiconductor in said barrier layer comprises AlN.

6. The semiconductor as in claim 4, wherein a composition and a thickness of said channel layer and said barrier layer are set so that a two-dimensional electron gas does not generate at a hetero-interface when a voltage is not applied to a gate electrode of said hetero-junction field effect transistor.

7. A semiconductor device, provided with:
a hetero-junction field effect transistor in which a channel layer comprising a first nitride semiconductor and a barrier layer comprising a second nitride semiconductor having a larger band gap than that of said first nitride semiconductor form a hetero-junction, said second nitride semiconductor including Ga, wherein said band gap of said barrier layer is 4.5 eV or more, and a high concentration n-type impurity region having an impurity concentration of $1 \times 10^{18}$ cm$^{-3}$ or more is formed immediately below source/drain electrodes of said hetero-junction field effect transistor.

8. A semiconductor device provided with:
a hetero-junction field effect transistor in which a channel layer comprising a first nitride semiconductor and a barrier layer comprising a second nitride semiconductor having a larger band gap than that of said first nitride semiconductor form a hetero-junction, wherein said first nitride semiconductor in said channel layer is $Al_xGa_{1-x}N$ ($0.16 \leq x < 1$), and a high concentration n-type impurity region having an impurity concentration of $1 \times 10^{18}$ cm$^{-3}$ or more is formed immediately below source/drain electrodes of said hetero-junction field effect transistor.

9. A semiconductor device, provided with:
a hetero-junction field effect transistor in which a channel layer comprising a first nitride semiconductor and a barrier layer comprising a second nitride semiconductor having a larger band gap than that of said first nitride semiconductor form a hetero-junction, wherein said second nitride semiconductor in said barrier layer is $Al_yGa_{1-y}N$ ($0.39 \leq y < 1$), and a high concentration n-type impurity region having an impurity concentration of $1 \times 10^{18}$ cm$^{-3}$ or more is formed immediately below source/drain electrodes of said hetero-junction field effect transistor.

* * * * *